United States Patent
Chen et al.

(10) Patent No.: US 7,826,504 B2
(45) Date of Patent: Nov. 2, 2010

(54) ACTIVE TERAHERTZ METAMATERIAL DEVICES

(75) Inventors: Houtong Chen, Los Alamos, NM (US); Willie John Padilla, Newton, MA (US); Richard Douglas Averitt, Newton, MA (US); John F. O'Hara, Los Alamos, NM (US); Mark Lee, Albuquerque, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 21 days.

(21) Appl. No.: 12/418,064

(22) Filed: Apr. 3, 2009

(65) Prior Publication Data

US 2009/0262766 A1  Oct. 22, 2009

Related U.S. Application Data

(63) Continuation of application No. PCT/US2007/082023, filed on Oct. 19, 2007.

(60) Provisional application No. 60/853,503, filed on Oct. 19, 2006.

(51) Int. Cl.
*H01S 5/00* (2006.01)
*H01Q 15/22* (2006.01)

(52) U.S. Cl. ............................ 372/43.01; 343/700 MS; 343/741

(58) Field of Classification Search ................ 372/4, 372/43.01–45; 343/700 MS, 741, 900
See application file for complete search history.

(56) References Cited

U.S. PATENT DOCUMENTS

| 4,982,243 | A |  | 1/1991 | Nakahata et al. |
|---|---|---|---|---|
| 5,017,897 | A |  | 5/1991 | Ooi et al. |
| 5,374,564 | A |  | 12/1994 | Bruel |
| 5,903,050 | A |  | 5/1999 | Thurairajaratnam et al. |
| 5,936,989 | A |  | 8/1999 | Capasso et al. |
| 6,026,108 | A |  | 2/2000 | Lim et al. |
| 7,113,534 | B2 |  | 9/2006 | Unterrainer et al. |
| 7,205,941 | B2 | * | 4/2007 | Wang et al. ............ 343/700 MS |
| 7,446,929 | B1 | * | 11/2008 | Jayaraman et al. .......... 359/299 |
| 7,480,434 | B2 | * | 1/2009 | Hochberg et al. ............ 385/122 |
| 7,683,444 | B2 | * | 3/2010 | Tonucci ....................... 257/421 |
| 2006/0092079 | A1 |  | 5/2006 | de Rochemont |
| 2006/0109541 | A1 | * | 5/2006 | Osipov et al. ................ 359/321 |
| 2006/0125681 | A1 | * | 6/2006 | Smith et al. .................. 342/120 |
| 2008/0165079 | A1 | * | 7/2008 | Smith et al. ............. 343/911 R |
| 2009/0009853 | A1 | * | 1/2009 | Tonucci ....................... 359/298 |

* cited by examiner

*Primary Examiner*—Minsun Harvey
*Assistant Examiner*—Phillip Nguyen
(74) *Attorney, Agent, or Firm*—John P. O'Banion

(57) ABSTRACT

Metamaterial structures are taught which provide for the modulation of terahertz frequency signals. Each element within an array of metamaterial (MM) elements comprises multiple loops and at least one gap. The MM elements may comprise resonators with conductive loops and insulated gaps, or the inverse in which insulated loops are present with conductive gaps; each providing useful transmissive control properties. The metamaterial elements are fabricated on a semiconducting substrate configured with a means of enhancing or depleting electrons from near the gaps of the MM elements. An on to off transmissivity ratio of about 0.5 is achieved with this approach. Embodiments are described in which the MM elements incorporated within a Quantum Cascade Laser (QCL) to provide surface emitting (SE) properties.

20 Claims, 25 Drawing Sheets

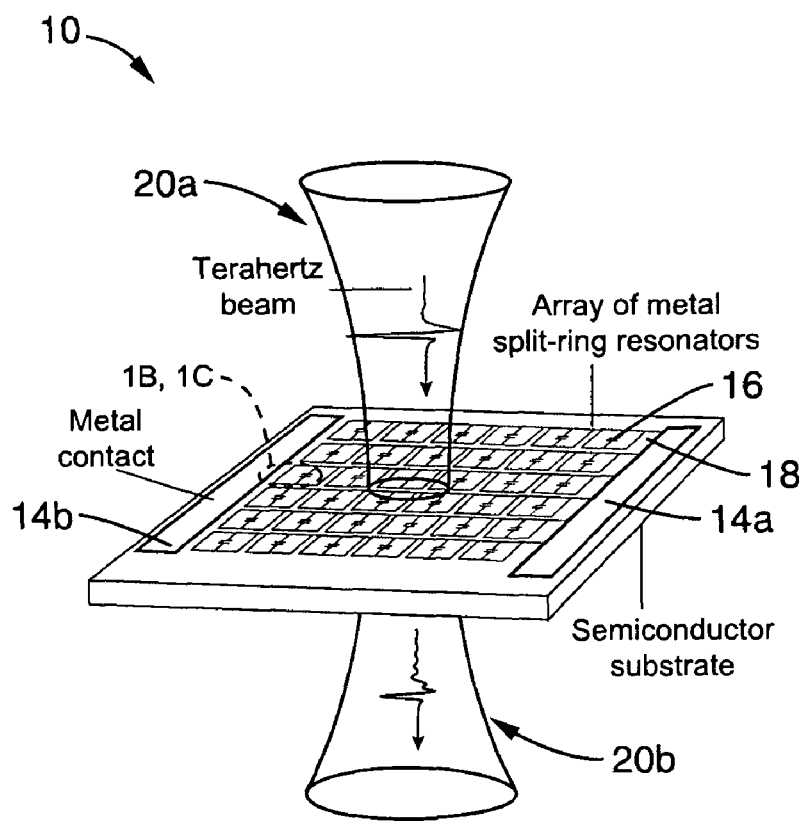
FIG. 1A
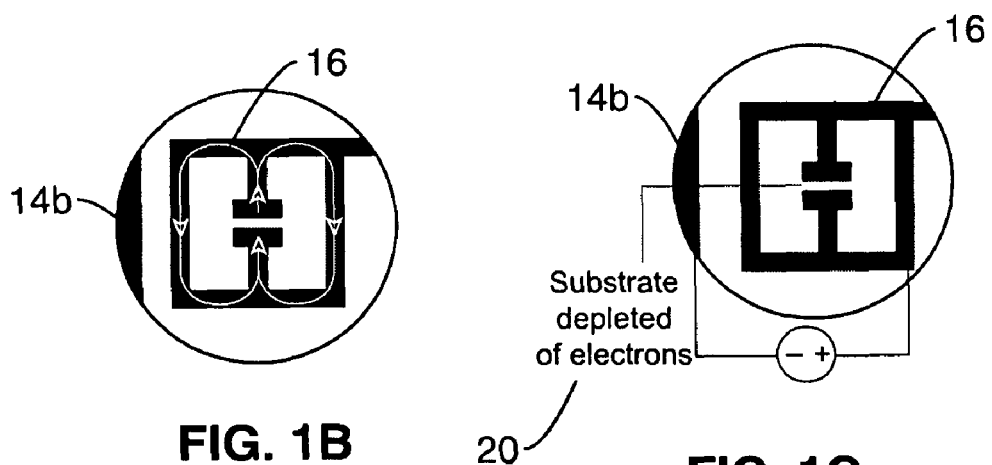
FIG. 1B  FIG. 1C

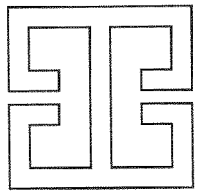
FIG. 17
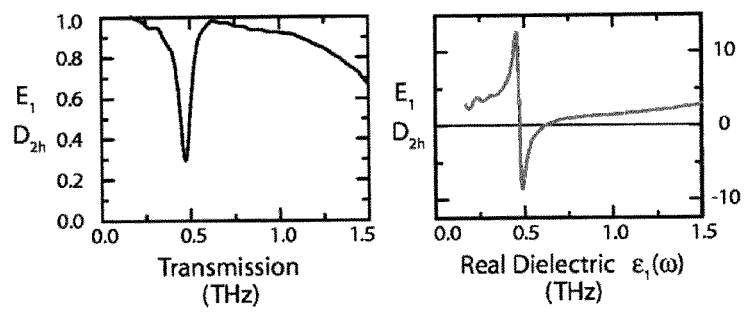
FIG. 18            FIG. 19
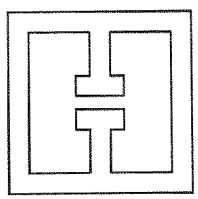
FIG. 20
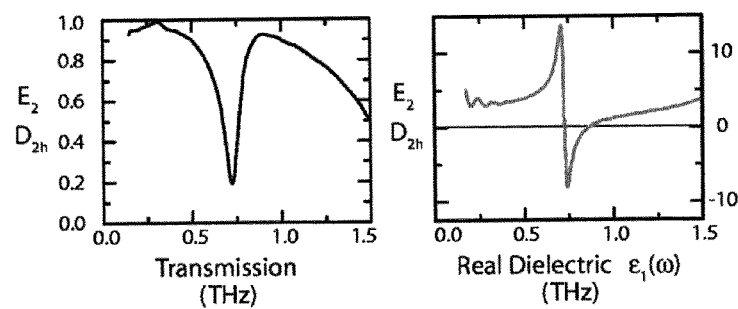
FIG. 21            FIG. 22
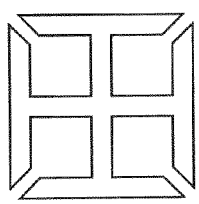
FIG. 23
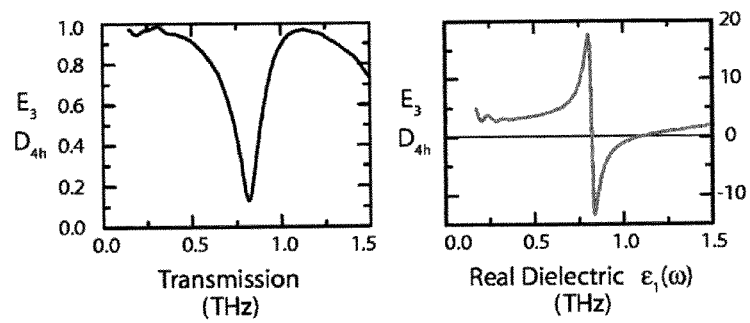
FIG. 24            FIG. 25

Transmission
(THz)

Real Dielectric $\varepsilon_1(\omega)$
(THz)

Real Dielectric $\varepsilon_1(\omega)$
(THz)

US 7,826,504 B2

ACTIVE TERAHERTZ METAMATERIAL DEVICES

CROSS-REFERENCE TO RELATED APPLICATIONS

This application is a 35 U.S.C. §111 (a) continuation of, co-pending PCT international application serial number PCT/US2007/082023, filed on Oct. 19, 2007, incorporated herein by reference in its entirety, which claims priority from U.S. provisional application Ser. No. 60/853,503 filed on Oct. 19, 2006, incorporated herein by reference in its entirety. Priority is claimed to each of the listed applications.

STATEMENT REGARDING FEDERALLY SPONSORED RESEARCH OR DEVELOPMENT

This invention was made with Government support under Contract No. DE-AC52-06NA25396 awarded by the U.S. Department of Energy. The Government has certain rights in this invention.

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

A portion of the material in this patent document is also subject to protection under the maskwork registration laws of the United States and of other countries. The owner of the maskwork rights has no objection to the facsimile reproduction by anyone of the patent document or the patent disclosure, as it appears in the United States Patent and Trademark Office publicly available file or records, but otherwise reserves all maskwork rights whatsoever. The maskwork owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to high frequency detection and control, and more particularly to THz modulation with metamaterials.

2. Description of Related Art

Substantial research is being performed on metamaterials used for microwave radiation, and is in part due to the ease of fabrication of sub-wavelength structures at these frequencies. Indeed, negative refractive index media composed of negative permittivity ($\in_1<0$) and negative permeability ($\mu_1<0$) metamaterial elements was first demonstrated at microwave frequencies. As a result intense theoretical, computational and experimental studies of exotic phenomena have arisen, such as perfect lensing and cloaking. Recently, researchers have ventured to create functional metamaterials at near-infrared and visible frequencies. Considerably less work has been directed in the THz frequencies, although the design flexibility associated with metamaterials may prove promising from a device perspective in filling the THz gap.

Metamaterials are geometrically scalable, which translates to operability over many decades of frequency. This engineering tunability is in fact a distinguishing and advantageous property of these materials. However, for many applications it is desirable to have real-time tunability. For instance, short-range wireless THz communication or ultrafast THz interconnects require switches and modulators. Current state-of-the-art THz modulators based on semiconducting structures have the desirable property of being broadband, which is of relevance to THz interconnects. However, these semiconducting structures are only capable of a few percent modulation and usually require cryogenic temperatures. Therefore, further improvement in the performance characteristics of these devices is required before practical application can be made of them.

Accordingly a need exists for apparatus and methods of performing switching and modulation at THz frequencies, including amplitude modulation of narrowband devices, for example THz quantum cascade lasers, thus enabling near-term practical applications. These needs and others are met within the present invention, which overcomes the deficiencies of previously developed apparatus and methods of THz generation and control.

BRIEF SUMMARY OF THE INVENTION

The development of artificially structured electromagnetic materials, termed metamaterials, has led to the realization of phenomena that cannot be obtained with natural materials. This is especially important for the technologically relevant terahertz (1 THz=$10^{12}$ Hz) frequency regime; many materials inherently do not respond to THz radiation, and the tools that are necessary to construct devices operating within this range—sources, lenses, switches, modulators and detectors—largely do not exist. Considerable efforts are underway to fill this 'THz gap' in view of the useful potential applications of THz radiation. Moderate progress has been made in THz generation and detection, with THz quantum cascade lasers being a recent example. However, techniques to control and manipulate THz waves are lagging behind.

Active metamaterial devices are demonstrated herein that are capable of efficient real-time control and manipulation of THz radiation. By way of example, and not limitation, one device consists of an array of gold electric resonator elements (the metamaterial) fabricated on a semiconductor substrate. The metamaterial array and substrate together effectively form a Schottky diode, which enables 50% modulation of THz transmissivity, which is an order of magnitude improvement over existing devices.

The invention is amenable to being embodied in a number of ways, including but not limited to the following.

One implementation of the invention is an apparatus for modulating terahertz radiation, comprising: (a) a substrate comprising a doped semiconductor material; (b) an array of multi-loop split-ring resonators on the substrate, wherein the multi-loop split ring resonators are of a size less that the wavelength of the incident terahertz radiation; (c) at least one gap in each of the split-ring resonators, the gap configured to modulate the circulation of current flow in the split-ring resonator; wherein the gap (at least one in each MM resonator) is configured for generating a resonant response with alternating charge accumulation in response to the presence of the gap; and (d) means for externally exciting electrons in the substrate for modulating the resonance of the array of multi-loop split-ring resonators to control the transmissive ratio of the apparatus.

The MM resonators can comprise either original MM resonators having multiple loops of conductive material within which at least one insulated gap is interposed, or complementary MM resonators, which are inverse of the original, and have multiple looping regions on the substrate which are non-conductive within which at least one conductive gap is interposed.

The gap in each split-ring resonators can operate to drive the capacitance toward zero, and thus dampens resonant response, when sufficient electrons are present near the gap. Alternatively, capacitance of the gaps in the resonators increases, and thus increases resonant response, in response to the depletion of electrons from the gap.

The modulator provides excellent transmissivity ratio of approximately 0.5, and can be operated at room temperature. The resonators in the modulator provide a resonant response although without a negative refractive index. At frequencies near the characteristic frequency of the resonant electron flow, the values of permittivity (∈) and permeability (μ) vary over a wide range in response to small changes in frequency. This modulator is easy to fabricate with a substrate comprising a sufficiently thin layer of semiconductor to allow the passage of a substantial portion of the terahertz radiation during portions of resonant cycles within the split-ring resonators. Preferably, the substrate comprises a lightly-doped semiconductor material.

The modulator may be incorporated within various devices in numerous fields, including imaging, communication and laser devices. The modulator technology can be incorporated in any terahertz devices, or of similar optical frequency range, when a means for externally exciting the substrate is provided, thus changing the depletion or enhancement of electrons near the MM resonator gaps. For example, the substrate can be configured with electrical contacts (e.g., ohmic contact and at least one Schottky contact) for receiving a modulating signal which is coupled through conductors to the multi-loop split-ring resonators. Alternatively, or additionally, the electrons can be excited optically, or by other means, to thus control the resonance and thus transmissivity.

The MM modulator can be incorporated within a Quantum Cascade Laser (QCL) to permit device operation in a surface emitting mode through the array of multi-loop split-ring resonators configured on an active region of the QCL device.

One implementation of the invention is an apparatus for modulating terahertz radiation, comprising: (a) a substrate comprising a thin and lightly-doped semiconductor material, in which the substrate comprises a sufficiently thin layer semiconductor material to allow the passage of a substantial portion of the terahertz radiation during portions of resonant cycles within the split-ring resonators; (b) an array of multi-loop split-ring resonators on the substrate, in which the multi-loop split ring resonators are of a size less that the wavelength of the incident terahertz radiation; (c) at least one gap each of the split-ring resonators, the gaps configured to modulate the circulation of current flow in the split-ring resonator, in which each of the gaps are configured for generating a resonant response with alternating charge accumulation in response to the presence of the at least one gap, and in which the gap in the split-ring resonators drives the capacitance toward zero, and thus dampens resonant response, of the split-ring resonators in response to the presence of electrons in the gap; and wherein the capacitance of at least one gap in the split-ring resonators increases, and thus increases resonant response, of the split-ring resonators in response to the depletion of electrons from the gap; (d) electrical contacts coupled to the array of multi-loop split-ring resonators for exciting electrons in the substrate to control their position in relation to the at least gap in the split-ring resonators and thus modulate the resonance of the array of multi-loop split-ring resonators for controlling the transmissive ratio of the apparatus.

One implementation of the invention is a surface emitting (SE) quantum cascade laser (QCL), comprising: (a) a substrate comprising a doped semiconductor material; (b) a first electrode on the surface of the substrate; (c) an active region upon the first electrode; (d) a second electrode comprising an array of multi-loop split-ring resonators on the surface of the active region, wherein the multi-loop split ring resonators are of a size less that the wavelength of the characteristic terahertz radiation; (e) at least one gap in the split-ring resonators, the gap configured to modulate the circulation of current flow in the split-ring resonator, and wherein the at least one gap is configured for generating a resonant response with alternating charge accumulation in response to the presence of the at least one gap; and (f) contacts on the first electrode and the second electrode through which a modulation signal is received for exciting electrons in the active region for modulating the resonance of the array of multi-loop split-ring resonators to control the surface emission from the transmissive ratio of the quantum cascade laser.

One implementation of the invention is a method of modulating transmissivity of a metamaterial structure at terahertz frequencies, comprising: (a) establishing a periodic array of metamaterial elements upon a semiconductor device layer; (b) configuring each metamaterial element to have multiple loops with at least one gap; (d) receiving an electrical modulation signal for controlling the transmissivity of the metamaterial structure; (e) depleting the number of electrons near the gaps of the periodic array of metamaterial structures to provide a first level of transmissivity in response to a first level of electrical modulation; (f) enhancing the number of electrons near the gaps of the periodic array of metamaterial structures to provide a second level of transmissivity in response to a second level of electrical modulation; and (f) generating a resonant response with alternating charge accumulation near gaps in each the metamaterial element in the periodic array in response to the presence of electrons near the gaps in each the metamaterial element toward changing transmissivity.

The present invention can provide a number of beneficial aspects which can be implemented either separately or in any desired combination without departing from the present teachings.

Each of the foregoing aspects, and related modes, embodiments, variations, and features thereof, is considered of independent value and benefit as an invention presented hereunder, as are the various combinations therebetween as presented throughout this disclosure and otherwise readily apparent to one of ordinary skill having reviewed these disclosed contents. Further aspects of the present disclosure and inventions contained hereunder will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIG. 1A is a perspective view of a resonant metamaterial oscillator according to the invention showing an array of split-ring resonators.

FIG. 1B-1C are plan views of characteristics within a single split-ring resonator according to aspects of the present invention.

FIG. 17 is a schematic of a square polarized MM element having two outer gaps according to an aspect of the present invention.

FIG. 18-19 are graphs of characteristics for the MM element of FIG. 17.

FIG. 20 is a schematic of a square polarized MM element having a single inner gap according to an aspect of the present invention.

FIG. 21-22 are graphs of characteristics for the MM element of FIG. 17.

FIG. 23 is a schematic of a square non-polarized MM element having four outer gaps according to an aspect of the present invention.

FIG. 24-25 are graphs of characteristics for the MM element of FIG. 17.

DETAILED DESCRIPTION OF THE INVENTION

Figure 2:
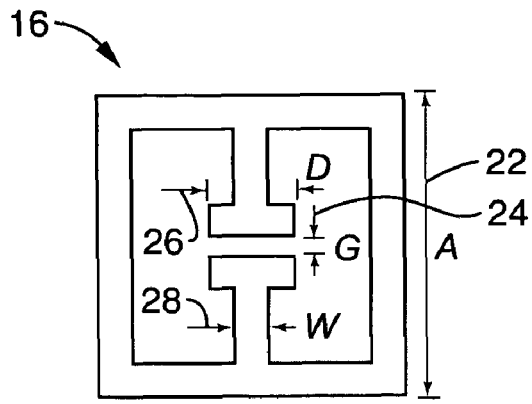
FIG. 2 is a plan view of an active THz metamaterial split-ring resonator according to an aspect of the present invention.

Referring more specifically to the drawings, for illustrative purposes the present invention is embodied in the apparatus generally shown in FIG. 1 through FIG. 60 and FIG. 62 through FIG. 70. It will be appreciated that the apparatus may vary as to configuration and as to details of the parts, and that the method may vary as to the specific steps and sequence, without departing from the basic concepts as disclosed herein.

The following description is provided in a number of sections. As these sections are based on separate documents and articles, the descriptions overlap in many areas.

1. Introduction to Terahertz MM Modulators

Discussed in this introduction are the use of resonators (e.g., metal) for creating a material with tunable responses to an applied voltage. When combined with a semiconductor substrate, these materials can be used to control technologically promising terahertz radiation.

Electromagnetic radiation with frequencies lying between the microwave region and the infrared, referred to as terahertz radiation, holds promise for imaging and sensing applications. It is non-ionizing, and therefore causes less damage to biological tissue than conventional, higher-energy X-rays. It penetrates plastics and clothing, but not metal, and so is ideal for security screening and non-contact testing or inspection. But to realize the full potential of terahertz radiation, more sophisticated techniques for its generation, manipulation and detection are required.

In this issue the teachings of the present invention fill a number of important gaps in THz capabilities. The development of an efficient, electrically driven modulator for terahertz signals that functions at room temperature. These materials engineered to have electromagnetic responses that are impossible in naturally occurring materials, such as a negative refractive index. The refractive index of a material, n, is a measure of the speed of light in the material, and is given by $n=(\mu \in)^{1/2}$, where $\mu$ is the material's "permeability" to magnetic fields, and $\in$ its 'permittivity' to electric fields. All naturally occurring materials have positive $\mu$, while transparent materials also have positive $\in$. In these normal materials, therefore, the refractive index is a real and positive number.

Soviet physicist Victor Veselago showed in 1968 that a hypothetical material with negative $\in$ and $\mu$ would also have a real refractive index, meaning that light waves could propagate through the material, but would behave as though its refractive index were negative. This material would have unusual and potentially valuable properties. A flat slab of negative-index material, for example, would focus light in much the same way as a curved slab of ordinary material (i.e., a lens), however, directed to a smaller focal spot. Although negative-index materials do not violate any laws of physics, the absence of a medium with negative $\mu$ confined the idea to the realm of speculation. Yet in the late 1990s, John Pendry found, that by assembling a collection of appropriately designed metallic structures, a material could be fabricated that has both negative $\in$ and negative $\mu$ for incident electromagnetic radiation of a particular frequency. Furthermore, if the metal structures are each much smaller than the wavelength of the incident radiation, the radiation interacts with them not individually, but collectively, according to their average properties. These are the engineered materials now known as metamaterials. Engineering a material with negative $\in$ was easy, as it equates to opacity, a property of all metals for incident radiation below a certain frequency. It was necessary to show only that a discrete set of thin metallic structures could mimic this property of the bulk metal. A more difficult task was achieving a negative $\mu$. It turned out that this could be done using a pair of concentric metallic rings with gaps that prevent current from circulating. Because these rings are both capacitors (they store electric charge) and inductors (they induce magnetic fields that self-sustain any current flowing through them), the presence of gaps leads to a resonant response, with charge accumulating alternately on one side of the gap and then the other, moving back and forth through the rings rather as a mass vibrates back and forth on a spring. At frequencies near the characteristic frequency of this resonant electron flow, $\in$ and $\mu$ can vary dramatically as a function of frequency. Indeed, either one can become negative if the resonance is strong enough.

The development of the split-ring-resonator concept was significant not only because it permits a negative refractive index, but more generally because it represents a new technique for "designing" the optical response of a medium. The first experimental demonstration of a negative index, along with nearly all research into metamaterials until now, was performed in the microwave regime. This region encompasses gigahertz frequencies below the terahertz regime, with wavelengths of several millimeters or longer. It was almost immediately recognized, however, that the approach could be extended into the shorter-wavelength, terahertz regime simply by shrinking the size of the individual metallic components so that they remained smaller than the incident radiation's wavelength. At 1 THz, this is 300 μm, so the fabrication of a negative-index medium requires the technically challenging construction of three-dimensional objects with micrometer-scale features. Two-dimensional patterns on that scale, on the other hand, can be easily generated using conventional photolithography, and these patterns can be designed to exhibit a strong resonance in either $\in$ or $\mu$ at any frequency of interest.

The present invention utilizes the split-ring-resonator concept as the starting point for a metamaterial that provides a resonant response in $\in$ the terahertz range; although not a negative refractive index. Furthermore, the teachings show that this resonance can be externally controlled, and therefore can be exploited as a modulator for controlling the transmission of terahertz electromagnetic radiation. The principle of device operation is simple and elegant.

FIG. 1A illustrates an embodiment of a metamaterial modulator 10 having a substrate 12 having contacts 14a, 14b, on which an array of sub-wavelength split-ring resonators 16 are implemented, such as on top of a thin, lightly doped semiconductor layer and illuminated with a beam of terahertz radiation. When no external voltage is applied, the doped semiconducting substrate conducts. FIG. 1B depicts current circulating around the two lobes of the resonator in response to the applied terahertz field. FIG. 1C illustrates the application of an external voltage, wherein the semiconductor ceases to conduct, as current can no longer flow through the ring gap. In response to the external voltage this gap begins to behaves as a capacitor, storing up charge. The capacitance gives rise to a resonant behavior at a frequency in the terahertz range, in which the electrons bounce back and forth between the upper and lower gap electrodes. The incident terahertz radiation drives this resonance efficiently, leading to the transfer of more energy from the beam to the electrons of the substrate. Thus, less radiation is transmitted through the device.

Considered another way, the electrons in the semiconductor substrate effectively short circuit the gap in the split rings, driving the capacitance of the rings to zero and damping their normal resonant response. In response to a negative voltage being applied to the metal structures, the electrons in the substrate beneath are repelled away from the gap. As electrons become depleted in the gap, current can no longer flow effectively and the gap behaves as a capacitor, storing electric charge. In this case, the resonance of the ring structure re-emerges, which gives rise to a pronounced change in the optical properties of the array at frequencies near its resonant frequency.

A number of benefits are shown for the inventive teachings. At the design frequency, the on-off transmission ratio of the device embodiment can provide more than a ten times greater transmission ratio over current state-of-the-art electrically operated modulators within this frequency range. These new designs are simpler to fabricate, and the modulator operates at room temperature. This excellent performance comes from the exquisite sensitivity of a metamaterial's response to the precise properties of its resonant substructures. The ability to electrically switch the properties of a metamaterial by fabricating it on a semiconductor substrate provides a new method for active control of terahertz devices.

Some challenges remain to be overcome, for example larger on-off transmission ratios will be required for many applications, while increasing the modulation speed would open a number of applications. The teachings point out that these difficulties can be addressed by optimizing both the pattern of the metal structures and the properties of the substrate, as well as the use of optical excitation of the MM material. The properties of the device are also dependent on the direction of the electric field vector (the polarization) of the incident radiation, wherein the resonant behavior of the split rings relies on this electric field driving current across the gaps, all of which are oriented in one particular direction. Designs of future devices may seek to eliminate or alternatively exploit this polarization sensitivity. Finally, one can imagine a structure for which not only the transmitted intensity, but also the resonant frequency, is externally controllable. Whatever the next stage of development might be, the resonator structures taught herein open a new and promising set of possibilities for the active control of terahertz radiation.

2. Active Terahertz Metamaterial Devices

By way of example embodiment, the metamaterial device described herein is based on an electric analogue to split-ring resonators (SRRs).

FIG. 1A-1C illustrates by way of example embodiment 10 of a resonant metamaterial modulator. In FIG. 1A a substrate 12 is shown having a contacts 14a, 14b and an array of metal split-ring resonators 16 coupled by wires 18. The structures is shown with a tunable resonant response as a Terahertz beam 20a, 20b. FIG. 1B illustrates conduction in the doped substrate when no external voltage is applied. FIG. 1C illustrates that the semiconductor ceases to conduct in response to the application of an external voltage.

Figure 3:
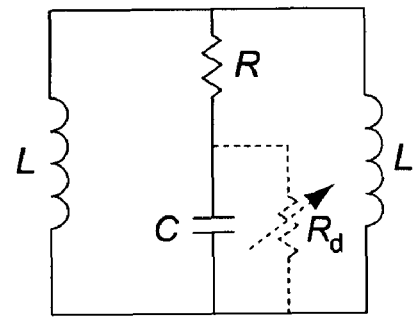
FIG. 3 is a schematic of an equivalent circuit for a metamaterial element according to an aspect of the present invention, showing the dashed variable resistance corresponding to loss due to substrate free carrier absorption within the split gap.
Figure 4:
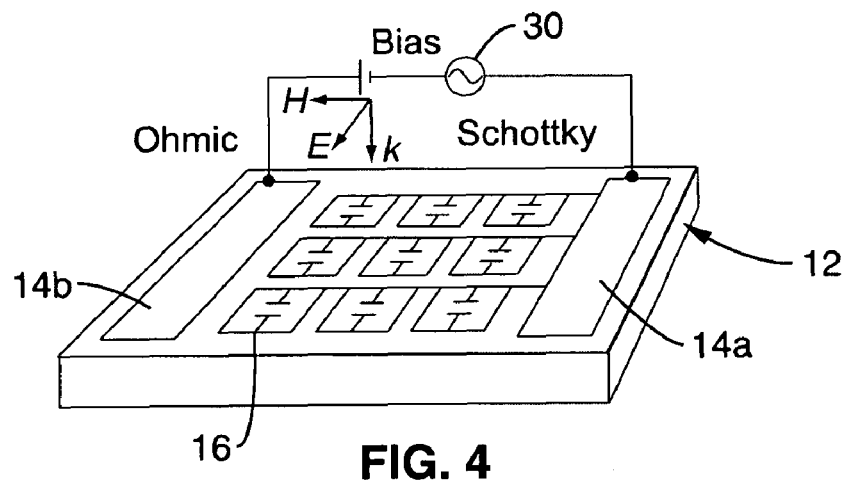
FIG. 4 is a perspective view of a metamaterial array having a period of 50 μm forming a planar array, which in this example embodiment is 5×5 mm.
Figure 5:
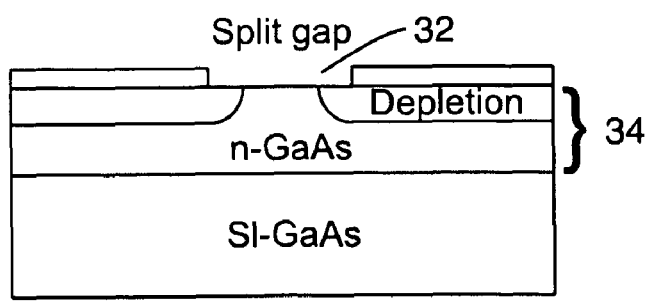
FIG. 5 is a cross-section of a substrate and the depletion region near the split gap with lines illustrating free charge carrier density.
Figure 6:
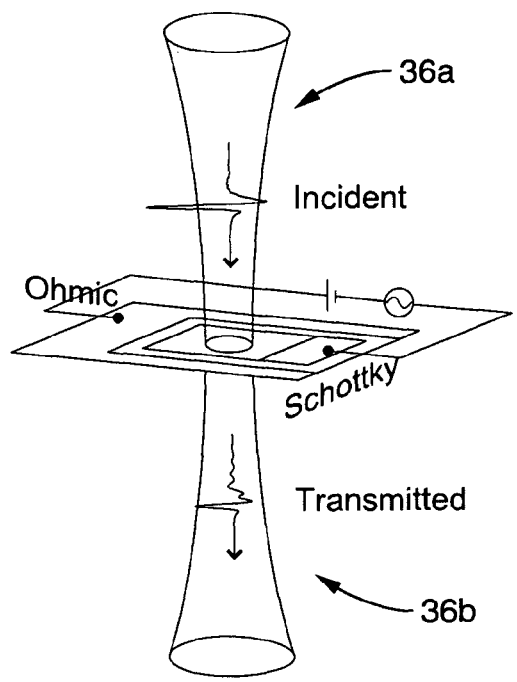
FIG. 6 is an perspective view of an experimental configuration for THz transmission measurements through a fabricated device according to an aspect of the present invention.

FIG. 2 through FIG. 6 illustrates details of the embodiment shown in FIG. 1A-1C of the active THz metamaterial device of the present invention. FIG. 2 depicts the geometry and dimensions of one embodiment of a THz metamaterial switch/modulator, having each cell with pitch 22 (i.e., A=36 µm), gap spacing 24 (i.e., G=2 µm), depletion length 26 (i.e., D=10 µm) and trace width 28 (i.e., W=4 µm). In FIG. 3 an equivalent circuit for the metamaterial element is shown with the dashed variable resistor corresponding to loss due to the substrate free carrier absorption within the split gap. In FIG. 4 metamaterial elements 16 are shown patterned with a period of 50 µm to form a planar array 10 of 5×5 mm². These elements 16 are connected together with metal wires 18 to serve as a metallic (Schottky) gate. A voltage bias 30 is shown applied between the Schottky and ohmic contacts 14a, 14b, to control substrate charge carrier density near the split gaps, thereby tuning the strength of resonance. Orientation of the incident THz wave is indicated and the polarization of the electric field, E, magnetic field, H, and wave vector, k, are shown. In FIG. 5 a diagram of the substrate 12 is shown with the depletion region 32 near split gap 24. Topographic lines illustrate the changes 34 in free charge carrier density in relation to gap 24. In FIG. 6 the experimental configuration for THz transmission measurements is shown with respect to this example embodiment. The black curves 36a, 36b illustrate measured time-domain waveforms of incident 36a and transmitted 36b THz pulses when a reverse gate voltage bias of 16V is applied to the device and the THz electric field is polarized perpendicular to connecting wires 18.

Referring again to FIG. 2 element 16 is shown consisting of two single split-ring resonators (SRRs) put together on the split gap side. These two rings provide inductances, L, and the split gap provides a capacitance, C, which were depicted in the equivalent circuit of FIG. 3. A frequency dependent dielectric resonant response results when this structure is patterned on a suitable substrate to form a planar periodic array of subwavelength structures. It should be appreciated that with the two inductive loops oppositely wound any magnetic response is cancelled, thus resulting in a net electric response. The resistor R models the dissipation in the gold split rings, while the variable resistor Rd (shown dashed) models dissipation due to the substrate free carrier absorption within the split gap.

In this embodiment the metamaterial elements are electrically connected using conducting wires 18 such that the entire metamaterial array functions as a voltage gate, schematically depicted in FIG. 4. This structure has been designed to enable voltage control of the conductivity of the substrate at the split gaps, thereby controlling the THz transmission. The substrate consists of a 1-mm-thick n-type gallium arsenide (GaAs) layer with a free electron density of $n=1.9 \times 10^{16}$ cm$^{-3}$ grown on a semi-insulating gallium arsenide (Si—GaAs) wafer by molecular beam epitaxy (MBE), as detailed in FIG. 5. By way of example, the ohmic contact 14b may be fabricated by electron-beam deposition, such as utilizing 20 nm of nickel, 20 nm of germanium, and 150 nm of gold in sequence, followed by rapid thermal annealing at 350° C. for 1 minute in a nitrogen atmosphere. Following The planar electric resonator array 10 is fabricated next using conventional photolithography and electron-beam deposition of a 10 nm-thick adhesion layer of titanium on the GaAs substrate, followed by 200 nm of gold. The metal and n-GaAs forms a Schottky junction and the connected metamaterial resonators serve as a metallic gate.

Figure 7:
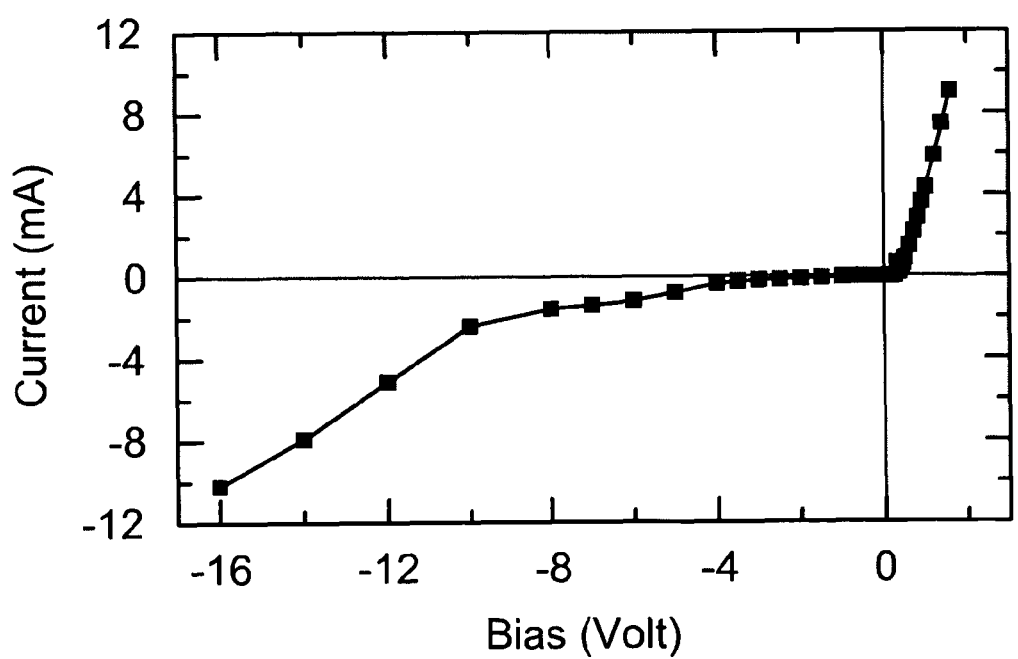
FIG. 7 is a plan view illustrating a simulating norm of the electric field for the array element according to an aspect of the present invention.

FIG. 7 depicts current-voltage (I-V) measurements on the structure which confirm the Schottky character of the device. Current rises rapidly with forwarding bias (positive voltage), while with reverse bias it is relatively small because of the Schottky depletion barrier. When the reverse bias voltage is further increased up to about −16 volts, the current significantly increases, which indicates it may be nearing the breakdown potential of the GaAs substrate. It will be recognized that in general, the breakdown voltage increases with decreasing doping density, thus it may enable more efficient switch/modulation of the THz radiation operating at smaller voltage as well as current.

Terahertz time-domain spectroscopy (THz-TDS) was used to characterize the performance of the metamaterial device, and has been described elsewhere in detail. In our photoconductive THz TDS experiment, a polyethylene lens focuses the linearly polarized THz beam onto the metamaterial sample to a diameter of about 3 mm, and a second polyethylene lens recollimates the transmitted THz beam, which is directed to a photoconductive receiver. The experiments were performed at room temperature in a dry air atmosphere.

In THz-TDS, the time-varying electric field of the impulsive THz radiation is recorded, and the electric field spectral amplitude and phase are directly obtained by performing Fourier analysis.

Measurements of the metamaterial device with respect to a suitable reference, as illustrated in FIG. 6, allow determination of the complex transmission as a function of frequency, $\tilde{t}(\omega)$. Inversion of $\tilde{t}(\omega)$ further permits model-independent calculation of the frequency dependent complex permittivity, $\tilde{\in}(\omega) = \in_1(\omega) + i\in_2(\omega)$, where $\in_1$ and $\in_2$ are the real and imaginary portions, respectively.

All experiments were performed at normal incidence, with the THz magnetic field lying completely in-plane. The polarization of the THz electric field was either perpendicular or parallel to the split gaps (and connecting wires). The wires connecting the individual electric resonators are necessary (as described above) to provide electrical connectivity to the gate. Importantly, these connecting wires have little effect on the electromagnetic properties of the electric resonators when the THz electric field is normal to the connecting wires. This was confirmed by finite element simulations using commercial software, as shown in FIGS. 2a and b.

Figure 8:
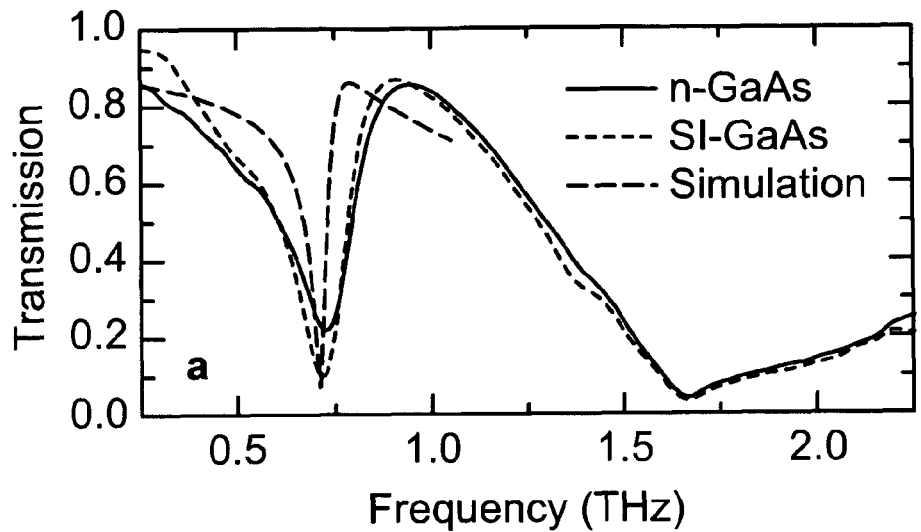
FIG. 8 is a plan view illustrating a simulation of surface current density of a metamaterial element at the 0.72 THz resonance frequency according to an aspect of the present invention.
Figure 9:
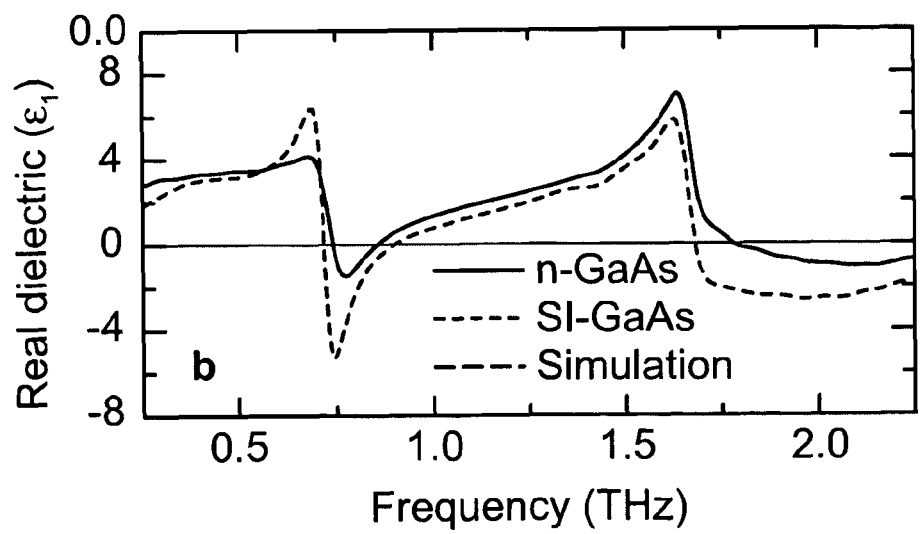
FIG. 9 is a graph of frequency dependent transmitted intensity of THz radiation according to an aspect of the present invention, showing an inset of individual resonant elements, connecting wires and the contact pad which forms the Schottky gate of the metamaterial device according to an aspect of the present invention.

FIGS. 8 and 9 illustrate experimental characterization of THz metamaterial devices at 0.72 THz resonance. FIG. 8 depicts frequency dependent transmitted intensity of THz radiation, while FIG. 9 depicts the corresponding extracted real part of the effective permittivity of the voltage controlled metamaterial device at 16V reverse gate bias and the same structure fabricated on an Si—GaAs substrate as shown on the legend of the graph. The dashed black curve is the simulated transmission for a device on the Si—GaAs substrate.

It can be seen from these results that the electric field is strongly concentrated at the split gaps, and there is no significant surface current flowing along the connecting metal wires between electric resonators at the resonant frequency (~0.72 THz).

Without an applied gate bias, the device is not expected to display resonant behavior associated with the electric resonators because the substrate free charge carriers short out the capacitive response associated with the gaps. Upon application of a voltage, a resonant transmission should result as carriers in the substrate are displaced from the gaps. The long dashed line in FIG. 8 shows the frequency-dependent transmitted intensity at a reverse gate bias of 16V, where the polarization of the incident THz electric field is perpendicular to the connecting wires. Two distinct resonances are observed. The 0.72 THz resonance is the LC response associated with circulating currents in each metamaterial element, while the resonance at 1.65 THz is due to in-phase dipolar currents along the 36 mm lengths of the elements. The spectrum is consistent with that from the same structure fabricated on an Si—GaAs substrate with no free carriers (red curve) and with simulation (black dashed curve), as shown in FIG. 2c. In FIG. 2d the real permittivity $\in_1$ (C) of the THz metamaterial devices is shown as extracted from the experimental data of FIG. 8 assuming a cubic unit cell.

Figure 10:
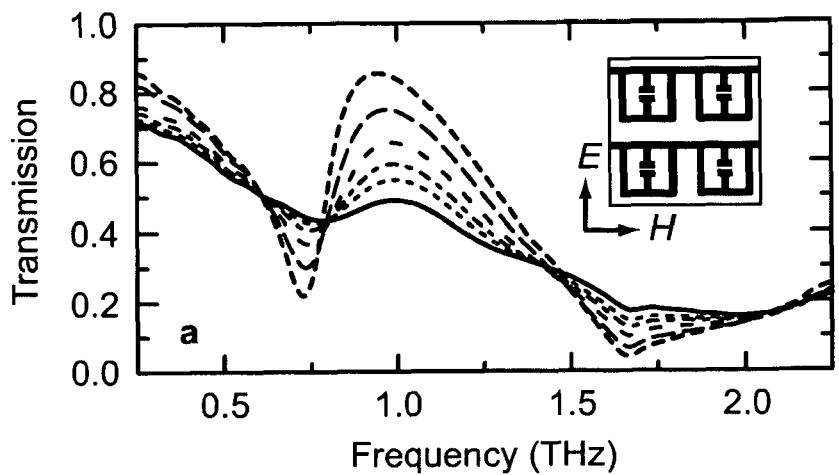
FIG. 10 is a graph of the extracted real part of effective permittivity of the voltage controlled metamaterial device according to an aspect of the present invention.
Figure 11:
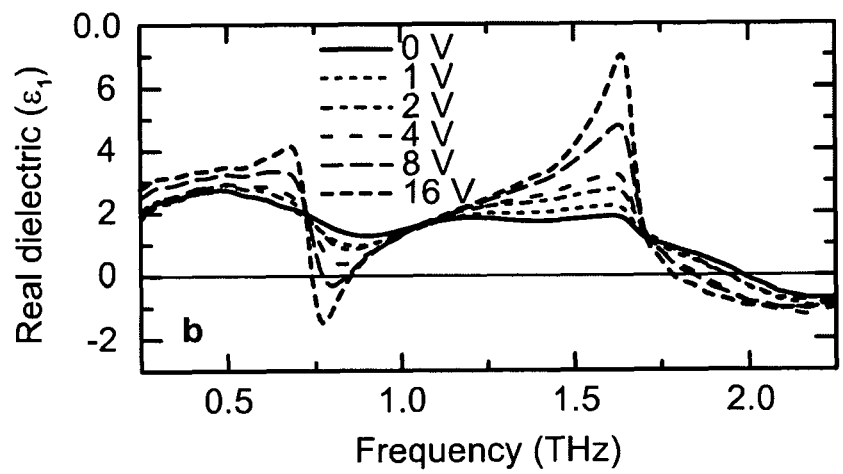
FIG. 11 is a graph of frequency-dependent transmission intensity of THz radiation with polarization perpendicular to the connecting wires according to an aspect of the present invention, and showing an inset with a small group of array elements.
Figure 12:
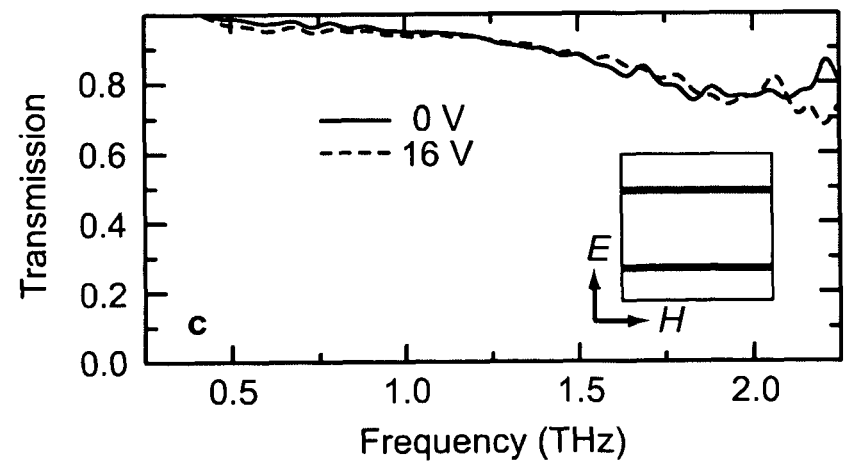
FIG. 12 is a graph of permittivity associated with FIG. 11 shown for various reverse gate biases according to an aspect of the present invention.

FIG. 10 through FIG. 12 illustrate the switching performance of the active THz metamaterial device as a function of gate voltage bias with the polarization of the THz electric field perpendicular to the connecting wires. From these graphs it can be seen that the resonances are strongly dependent on gate bias. In FIG. 10 frequency-dependent transmitted intensity of THz radiation is shown for the metamaterial structure shown in the inset. In FIG. 11 the corresponding permittivity for various reverse gate biases are shown. In FIG. 12 THz transmission through a device with metamaterials removed is shown at reverse biases of 0 and 16V. The insets show the polarization configuration of the THz electric and magnetic fields.

With zero applied voltage to the gate (solid black), the metamaterial response is very weak and does not show significant frequency dependence near the 0.72 THz resonance, as the relatively conductive substrate shorts the capacitive split gap and no LC resonance can be established. Increasing reverse gate bias depletes an increasing fraction of electrons in the n-GaAs layer near the metallic gate, thus significantly reducing the conductivity of the substrate near the split gaps, thereby restoring the LC resonant response. This conclusion is verified by the experimental results shown in FIG. 10, as the resonances in the transmission spectra narrow and increase in amplitude with increasing reverse bias. At a reverse gate bias of 16 V, a 50% relative intensity change of transmission is observed at 0.72 THz, making this device a reasonably efficient narrowband THz switch/modulator. We note that the transmitted intensity of the 1.65 THz resonance also decreases with bias. This is because the substrate carriers screen the dipolar currents and is not associated with shorting of the capacitive gap of the metamaterial elements. FIG. 11 shows the corresponding permittivity $\in_1(\omega)$ of the metamaterial device at various gate biases. Clearly, $\in_1(\omega)$ of the device is significantly modified by the applied gate bias. Permittivity $\in_1(\omega)$ increases on the low frequency side of the resonance while at higher frequencies it decreases to less than unity and even becomes negative.

From FIG. 10 it is evident that at frequencies (~1 THz) between the two resonances, the transmission is significantly enhanced as a function of reverse gate bias. Investigations were undertaken to determine whether this enhancement arose from a reduction of free carrier absorption in the n-GaAs layer due to depletion. For this purpose, a device was fabricated without the metamaterial array, wherein only the connecting wires remained as the Schottky contact. With the same polarization of the THz electric field, that is, perpendicular to the connecting wires as indicated by the inset of FIG. 12, THz transmission was measured at various bias voltages. As shown in FIG. 12 for reverse biases of 0 and 16 V, the change of THz transmission is hardly observable and variations are within the experimental noise. Additionally, we performed measurements of the free carrier absorption in the n-GaAs layer using an unpatterned sample with Si—GaAs as the reference. The relative intensity change of transmission between samples with carrier density $n=1.9 \times 10^{16}$ cm$^{-3}$ and $n<0$ is less than 10% at approximately 1 THz.

Furthermore, in our metamaterial device only a small fraction of the n-GaAs layer is depleted by the reverse gate bias and thus the reduction of free carrier absorption is not nearly enough to account for the change in transmission in FIG. 10. The transmission enhancement in this frequency range is dominated by the metamaterial structure and is largest in the vicinity where $\in_1 (\omega) \approx 1$.

This active metamaterial device was designed such that the LC resonant response occurs with the electric field polarized perpendicular to the connecting wires. This eliminates the Drude-like response that occurs when the THz electric field is parallel to the array of connecting wires. Nonetheless, with the electric field applied parallel to the connecting wires, a response that changes with applied bias is still observed.

Figure 13:
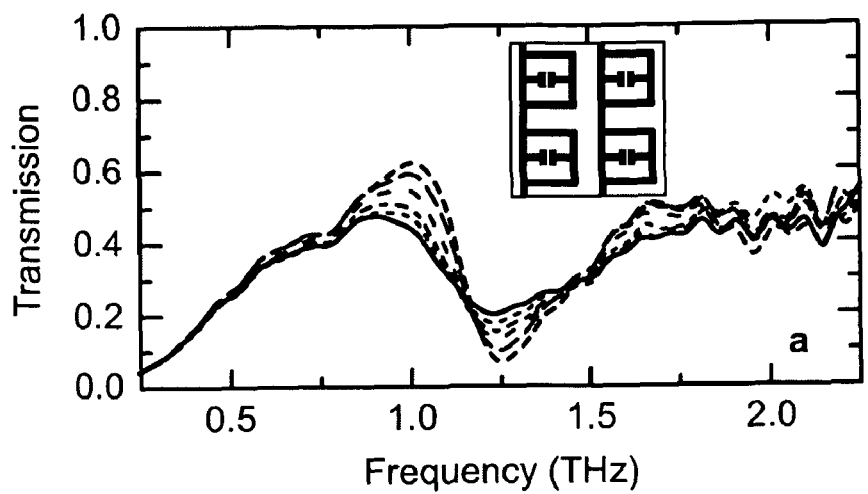
FIG. 13 is a graph of THz transmission associated with FIG. 11 shown through a device with metamaterials removed at two different reverse bias levels, and showing an inset of a substrate similar to FIG. 11 without the metamaterials.
Figure 14:
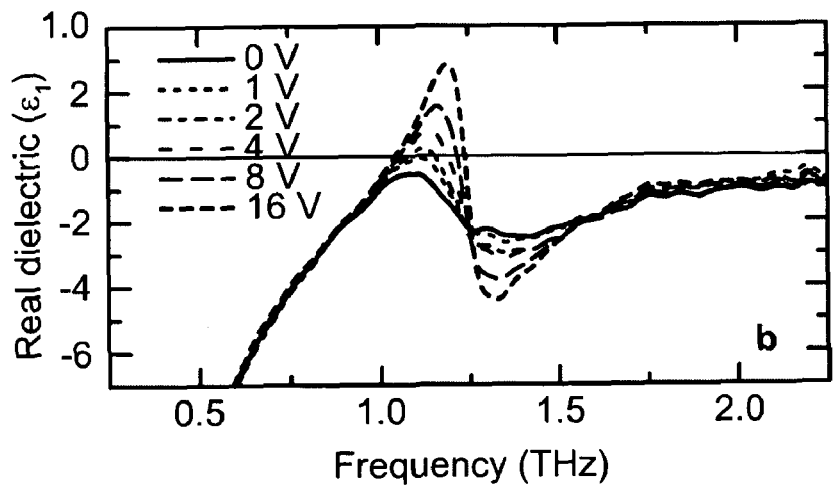
FIG. 14 is a graph of frequency-dependent transmission intensity of THz radiation with polarization parallel to the connecting wires according to an aspect of the present invention, and showing an inset with a small group of array elements.
Figure 15:
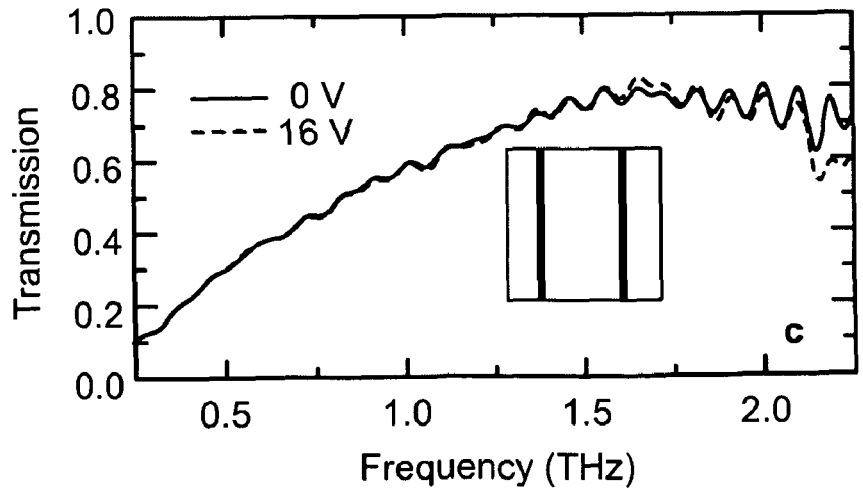
FIG. 15 is a graph of permittivity associated with FIG. 14 shown for various reverse gate biases according to an aspect of the present invention.

FIG. 13 through FIG. 15 illustrate the switching performance of the active THz metamaterial device as a function of gate voltage bias with the polarization of the THz electric field parallel to the connecting wires. In FIG. 13 it can be clearly seen that the transmissions are responsive to applied bias.

The small transmitted intensity at low frequencies results from the Drude-like response of the connecting wires. Superimposed on this is a resonance at 1.25 THz from the metamaterial elements. This resonant response is associated with dipolar currents in the elements analogous to the higher-lying resonance when the electric field is perpendicular to the connecting wires. As such, the variation in $\in_1 (C)$ shown in FIG. 14 arises from substrate carriers screening the dipolar currents. An applied bias depletes the carriers, thus restoring the dipolar resonant response. FIG. 15 shows the response for an array of parallel wires as the Schottky contact to the n-type substrate without the metamaterial elements. As expected, only a Drude-like response associated with the wires is observed. Thus, without the resonant metamaterial elements and their critical dependence upon substrate properties, it is not possible to modulate the transmission with an applied bias. This further confirms the importance of the metamaterial elements in creating active THz devices.

Substrates typically used to fabricate planar metamaterial structures (for example, Si, GaAs, Teflon) are insulators and are essentially lossless at THz frequencies. In this case, the metamaterial structure and the substrate can be modeled as an equivalent LCR resonant circuit as shown in FIG. 3 without the variable resistor Rd. However, when the substrate is lossy (in our case this is a result of doping), the finite resistance at the split gap has to be considered. The equivalent circuit should be modified by attaching a variable resistor in parallel to the capacitor. In this embodiment of the present invention the gate bias changes this resistance by depleting the free charge carriers and modifies the resonance strength. The fact that there are no significant shifts of the resonance frequencies indicates that the magnitude of the capacitance at the split gap is not strongly affected by the applied gate bias-rather, the capacitance is shunted.

Although the metamaterial structure presented here is a first generation device (that is, no optimization has been attempted), the performance as a THz modulator already exceeds current state-of-the-art electrical THz modulators, which are based on semiconductor structures, by an order of magnitude on resonance while it operates at room temperature. Higher modulation efficiency for practical applications is expected to be achievable through device optimization; that is, by varying the doping concentration and/or the thickness of the doping layer. Presently, however, the design as currently constituted does not provide for high frequency modulation. Measurements were performed of the THz intensity as a function of modulation frequency by applying a rectangular AC reverse gate bias alternating between 0 and 16V.

Figure 16:
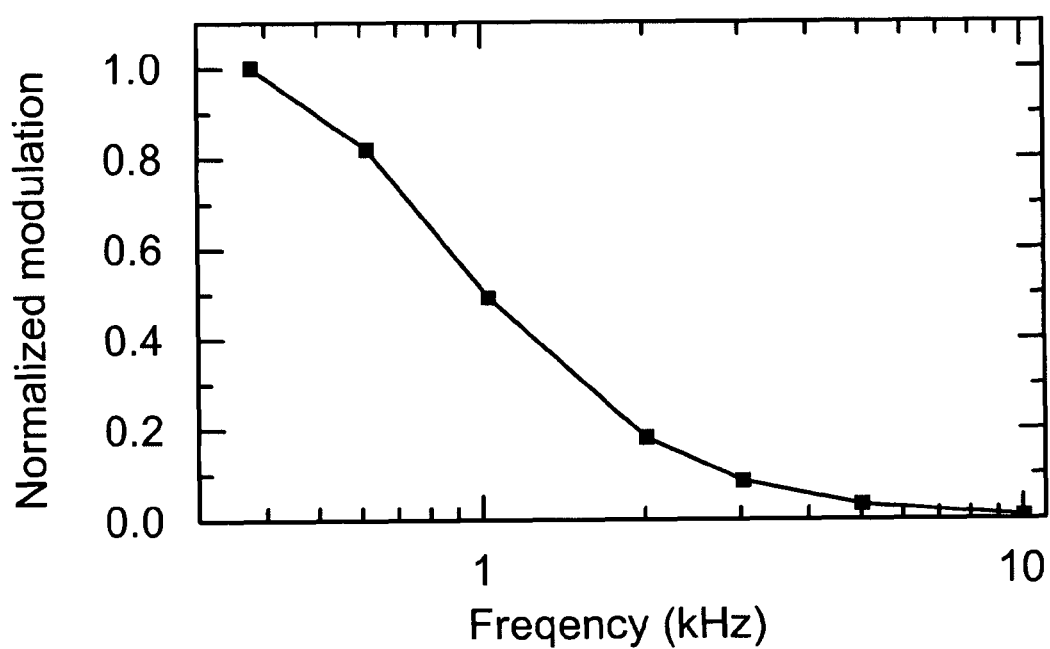
FIG. 16 is a graph of THz transmission associated with FIG. 14 shown through a device with metamaterials removed at two different reverse bias levels, and showing an inset of a substrate similar to FIG. 14 without the metamaterials.
Figure 26:
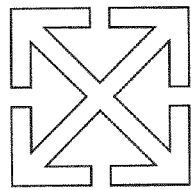
FIG. 26 is a schematic of a square non-polarized MM element having four outer gaps according to an aspect of the present invention.
Figure 27:
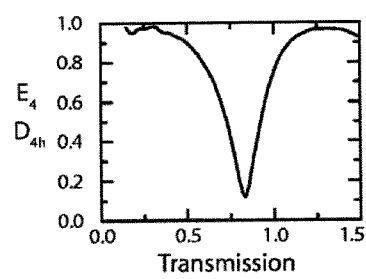
FIG. 27-28 are graphs of characteristics for the MM element of FIG. 17.
Figure 28:
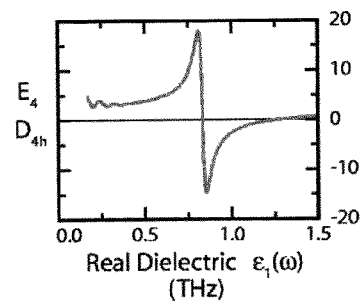
Figure 29:
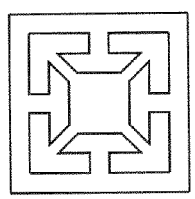
FIG. 29 is a schematic of a square non-polarized MM element having four inner gaps according to an aspect of the present invention.
Figure 30:
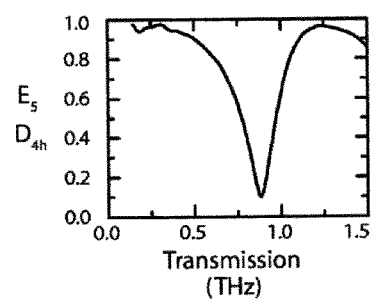
FIG. 30-31 are graphs of characteristics for the MM element of FIG. 17.
Figure 31:
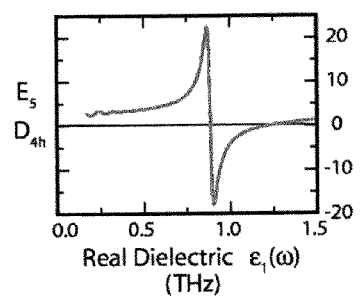
Figure 32:
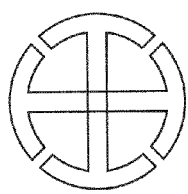
FIG. 32 is a schematic of a circular non-polarized MM element having four outer gaps according to an aspect of the present invention.
Figure 33:
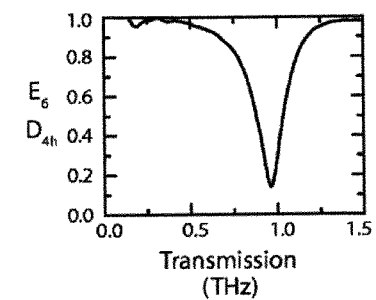
FIG. 33-34 are graphs of characteristics for the MM element of FIG. 17.
Figure 34:
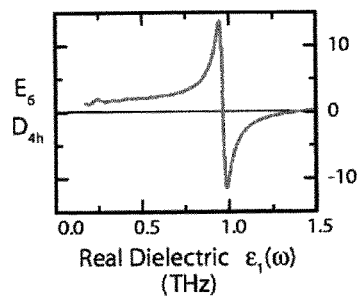

FIG. 16 is a graph of modulation with respect to frequency. The large area (5×5 mm$^2$) of the metamaterial array results in a large overall device capacitance, yielding a maximum modulation frequency of several kilohertz. FIG. 16 shows normalized THz intensity modulation as a function of frequency of the applied gate AC voltage bias. The modulation bias is a rectangular AC voltage alternating between 0 and 16 volts. The differential (modulation) THz signal was recorded in the time domain with a lock-in amplifier using the AC voltage frequency as the reference. The shape of the temporal wave forms of the differential signal has no significant change with respect to the modulation frequency, for example only the amplitude shrinks down with increasing modulation frequency. Here the normalized square of the peak value of the differential electric field (intensity) was plotted. It is evident that the device is only able to operate at low frequencies up to several kilohertz. This is because the device area (5×5 mm$^2$) results in a large overall device capacitance and the low doping leads to a high device resistance, which also indicates that we should be able to optimize our device to significantly improve the modulation frequency by pattering the n-doped GaAs layer and/or using interdigitated ohmic contacts to reduce the device capacitance and/or resistance. Significant increases in the modulation frequency are expected as ongoing embodiments reduce total capacitance and resistance of the device. This can be done, for example, by patterning the n-GaAs regions of the substrate and/or utilize interdigitated contacts.

This demonstration of an active metamaterial device relied on electrically connecting the individual metamaterial elements. It is important to emphasize that this does not compromise the resonant LC response of the elements, and thereby provides additional design flexibility for metamaterials in general. The approach presented here for active THz metamaterials naturally extends to magnetically resonant metamaterials. Finally, consideration of the substrate or embedding environment also offers considerable flexibility in the design of active metamaterial devices at any frequency range.

3. Electrically Resonant Terahertz Metamaterials

A class of artificial metamaterials is presented that exhibit a tailored response to the electrical component of electromagnetic radiation. These electric metamaterials are investigated theoretically, computationally, and experimentally using terahertz time-domain spectroscopy. These structures display a resonant response including regions of negative permittivity $\in_1 (\omega)$ ranging from approximately 500 GHz to 1 THz. Conventional electric media such as distributed wires are difficult to incorporate into metamaterials. In contrast, these localized structures will simplify the construction of future metamaterials, including those with negative index of refraction. As these structures generalize to three dimensions in a straightforward manner, they can be utilized in a wide range of applications for significantly enhancing the design and fabrication of functional terahertz devices.

Shaped dielectric and conducting materials which control the electric component of electromagnetic fields with a designed response have been known for some time. Recently, these "artificial dielectrics" have met with renewed interest in the burgeoning field of electromagnetic metamaterials (EM MMs). The excitement about EM MMs stems from the ability of these materials to exhibit an electromagnetic response not readily available in naturally occurring materials including, as examples, negative refractive index and artificial magnetism. However, such exotic phenomena only became possible following the realization that artificial materials could be designed to exhibit an effective material response to electric and magnetic fields. To date, artificial magnetic metamaterials have been experimentally demonstrated over several decades of frequency ranging from radio frequencies to terahertz and near infrared frequencies.

One form of element utilized for magnetic response is the split ring resonator (SRR). Since SRRs were first used to create negative index media, important advances have been realized. Researchers have demonstrated designs with higher symmetry, non-planar structures, and generalization to two and three dimensions. In contrast, purely electric metamaterials have experienced little improvement over the past 60 years and conducting wires have primarily been the medium of choice. Wires have a potential for some tunability, for example a modified plasma frequency can be obtained by making extremely thin wires or by adding loops, thus increasing their inductance. However, recent research has shown that wire arrays are have a number of undesirable characteristics. Limiting factors, for example, include the necessity of inter-unit-cell connections and specific surface terminations. For many applications, it would be preferable to have a localized element with finite extent from which one could construct materials with an electric response.

In principle, the SRR can also be used as an electrically resonant element as it exhibits a strong resonant permittivity at the same frequency as the magnetic resonance. However, the electric and magnetic resonant responses are coupled, resulting in rather complicated bianisotropic electromagnetic behavior. The development of more symmetric designs, which can be predicted by group theoretical methods, eliminates any magneto-optical coupling effects related to bianisotropy and yields electrically resonant structures. Furthermore, in the symmetric elements the magnetic response is suppressed. Thus, such elements will function as localized elements from which one can construct a purely electrical resonant response.

In this aspect of the invention a series of uniaxial and biaxial electric metamaterials are described. The design of these symmetric structures accomplishes the goal of creating a class of subwavelength elements which exhibit a resonant response to the electric field while minimizing or eliminating any response to the magnetic field. Planar arrays of these structures targeted for the THz frequency regime have been simulated, fabricated, and characterized in transmission. Each of the EM MM structures show a resonant response including a region of negative permittivity $\epsilon_1(\omega) < 0$. The advantages of these localized elements are discussed in comparison to conventional wire-segment electric media. In particular, benefits of these structures are discussed that will ease the burden of fabricating additional metamaterial devices including those exhibiting a negative index of refraction.

Embodiments of EM MMs taught herein may be readily fabricated in a planar array by conventional photolithographic methods and consist of 200 nm thick gold with a 10 nm thick adhesion layer of titanium on semi-insulating gallium arsenide (GaAs) substrates of 670 μm thickness. For the sake of simplicity of understanding and comparison all of the EM MM embodiments discussed in this section have an outer dimension of 36 μm, a lattice parameter of 50 μm, a linewidth of 4 μm, and a gap of 2 μm, although it will be appreciated that they may be fabricated of different sizes and geometric relationships. These arrays are characterized such as by utilizing THz time domain spectroscopy (TDS) at normal incidence. The time dependence of the electric field is measured and the complex transmissivity is obtained from which we calculate the complex dielectric function $\tilde{\epsilon}(\omega) = \epsilon_1 + i\epsilon_2$, assuming a cubic unit cell. The group-theoretical analysis is supplemented with finite-element numerical simulations of the EM MMs using commercial code and Lorentz oscillator fits to the data.

A number of different resonant element structures are discussed herein, as shown in FIG. 17 ($E_1 D_{2h}$), 20 ($E_2 D_{2h}$), 23 ($E_3 D_{4h}$), 26 ($E_4 D_{4h}$), 29 ($E_5 D_{4h}$), and 32 ($E_6 D_{4h}$), which are referred to in the text as $E_1$-$E_6$, and include a point group in Shoenflies notation. It should be appreciated that these configurations are examples only, and that a number of similar structures, and combinations thereof, can be created by one of ordinary skill in the art based on the teachings provided herein. Each of these elements is designed to exhibit a resonant response to the electric field while minimizing or eliminating any response to the magnetic field. It should also be noted that the elements can be configured with vertical polarization, horizontal polarization, and unpolarized, while additional variations can be implemented. In these examples the width of an element is approximately 36 μm, with a pitch of about 50 μm.

FIG. 17 through FIG. 34 illustrate resonant element structures along with associated test results in relation to both transmission and dielectric properties.

FIG. 17 depicts the configuration of an example element ($E_1$ in this case), while FIG. 18 and FIG. 19 depict experimental results for electric metamaterial elements. Similarly, FIG. 20 is another EM MM configuration with characteristics shown in FIG. 21 and FIG. 22. Likewise the remaining four element examples are described to illustrate that the principles herein can be implemented in a number of different structures configurations.

Simulations on the structures shown in FIGS. 17, 20, 23, 26, 29, and 32 illustrated that calculated surface current density provides a simple way to visualize the absence of a magnetic response; namely, the magnetic fields created by circulating surface currents cancel due to clockwise and counterclockwise components in adjacent regions of the element. Thus, any resonant response must necessarily be of electrical origin since there is no net circulation of current in each unit cell. In simulating the norm of the electric field at resonance it was seen that in the gap a strong local field enhancement was indicated which, according to the simulations, can be upwards of $10^4$ of the incident field.

Two graphs associated with each element structure show the experimentally measured field transmission $T(\omega)$ and the real part of the dielectric function $\epsilon_1(\omega)$, respectively. Each structure exhibits a very strong resonance with the transmission decreasing to as little as approximately 10%. Additionally, all of the EM MMs characterized in this study display regions of negative permittivity.

Table 1 summarizes a few characteristic parameters related to the $\epsilon(\omega)$ response, with important parameters that aid in quantifying the electric response of the metamaterials characterized in this study. Column 1 (leftmost column) gives the name of the element structure (as shown in FIG. 17, 20, 23, 26, 29, 32). Columns 2 and 3 show the center frequency of the oscillator $\omega_0$ and the zero crossing of the epsilon response $\omega_p$, respectively. The fourth column lists the minimum value of $\epsilon_1$ (min $\epsilon_1$) and the fifth column lists oscillator strength ($S = \omega_p^2/\omega_0^2$). Column six lists the region over which $\epsilon_1 < 0$ is achieved in terms of bandwidth BW (%) normalized by $\omega_0$. The last column lists the ratio of the free space wavelength at resonance ($\lambda_0/a$) to the unit-cell length (a=50 μm), an indication of how deep into the effective medium regime the materials are.

A Drude-Lorentz model was used to fit the $\epsilon_1(\omega)$ data, from which $\omega_0$ is extracted, which is the center frequency, and $\omega_p$, which is the frequency of the zero crossing of $\epsilon_1(\omega)$. In addition, the minimum value of $\in_1$ is listed, the oscillator strength $S=\omega_p^2/\omega_0^2$, the percentage bandwidth over which $\in_1<0$ is achieved, and the ratio of the free space wavelength to the unit-cell length, $\lambda_0/a$.

Next we compare these electrically resonant elements with wires, which are the canonical electric metamaterial. As mentioned, prior use of electric metamaterials relied upon straight wires which can be thought of as a bulk metal with a reduction in the effective electron density due to the reduction in volume fraction of the metal. A bulk metal has free electrons that screen external EM fields from penetrating inside the material for frequencies below the plasma frequency, defined as $\omega_p^2=4\pi ne^2/m^*$, where n is the effective electron density and $m^*$ is the effective mass. For an electric field polarized along the wire axis an effective medium response is obtained with a modified plasma frequency. Wires can also be formed with loops to add additional inductance to increase carrier mass and reduce the plasma frequency. Lastly, cuts can be added periodically along the wires to obtain a Drude-Lorentz response for added tunability. However, as discussed above, the disadvantages of wires limit their functionality as electric metamaterials.

Now discussed are several advantageous features of the inventive electric metamaterials which principally derive from their symmetry and localized extent. For THz metamaterials with characteristic lengths a=50 μm, the samples are easily fabricated with standard optical lithographic methods. The EM MMs shown in FIGS. 23, 26, 29 and 32 do not show polarization sensitivity, and thus a simple single normal incidence transmission measurement is all that is required to characterize their full electromagnetic behavior. As mentioned, samples in FIGS. 17 and 20 lack fourfold rotational symmetry and thus exhibit a different electric response for polarizations shown in these figures in comparison with polarizations rotated 90° to this orientation. Issues related to connectivity (as for wires) do not arise since the resonant response derives from elements within individual unit cells. Wires in two and three dimensions, from a fabrication viewpoint, are extremely difficult to implement. However, the electric structures presented here generalize to higher dimensions in a simple and straightforward manner, similar to SRRs.

As mentioned above, $E_1$-$E_6$ do not exhibit a magnetic response near the resonant frequency (i.e., μ=1). Thus, these elements are natural complements to magnetically active SRRs indicating that it is possible to create negative index materials through appropriate combinations of these two varieties of subwavelength elements. Although the thickness of the samples characterized in this study was relatively thin, for example 200 nm, $E_1$-$E_6$ yielded regions of negative permittivity and a substantial bandwidth. It should be noted that several simple ways exist in which to improve the response of the EM MMs in this study, namely, thicker samples, increased filling fraction, extension to multiple layer structures, and utilization of higher-conductivity metals. However, the results presented in FIG. 17 through FIG. 34 as well as Table 1 clearly show that the present metamaterials already display a pronounced and functional terahertz response which, when combined with magnetically resonant SRRs, will facilitate this approach to creating negative index metamaterials. At terahertz frequencies there is a lack of intrinsic response from natural materials, sometimes referred to in the industry as the "THz gap." Taking advantage of this void in THz electromagnetic material response is desirable for many potential applications such as personnel and luggage screening, explosives detection, and all weather imaging. The initial demonstration of several electric metamaterials at THz frequencies highlights their usefulness and versatility. These structures can be expected to play an important role in filling the THz gap.

Accordingly, designs for metamaterials have been presented which exhibit a tailored resonant electrical response investigated using THz time domain spectroscopy. The example embodiments offer significant advantages over current electric metamaterials, in terms of both fabrication as well as characteristics. Each of the EM MMs characterized in this study exhibits a negative dielectric response, the benefits for device fabrication one of ordinary skill in the art will appreciate. Furthermore, EM-MMs may be constructed to exhibit polarization-sensitive responses. These electric metamaterials can significantly reduce the burden of constructing negative index metamaterial devices, and the initial demonstrations of these devices at THz frequencies highlights their capabilities as functional electromagnetic materials.

4. Complementary Planar Terahertz Metamaterials

Planar electric split ring resonator (eSRR) metamaterials and their corresponding inverse structures are designed and characterized computationally and experimentally utilizing finite element modeling and THz time domain spectroscopy. A complementary response is observed in transmission. Specifically, for the eSRRs a decrease in transmission is observed at resonance whereas the inverse structures display an increase in transmission. The frequency dependent effective complex dielectric functions are extracted from the experimental data and, in combination with simulations to determine the surface current density and local electric field, provide considerable insight into the electromagnetic response of our planar metamaterials. These structures may find applications in the construction of various THz filters, transparent THz windows, or THz grid structures ideal for constructing THz switching/modulation devices.

4.1 Introduction

In recent years, terahertz (1 THz=$10^{12}$ Hz) science and technology has been a significant focus of many scientists and researchers worldwide. For instance, the development of THz sources and detectors have led to applications such as THz imaging, semiconductor characterization, chemical and biological sensing, as well as personnel and baggage security screening at airports. However, compared to the well established neighboring infrared and microwave regions, the THz region is still in need of fundamental technological advances. The challenge to bring THz applications to fruition arises in large part because it is difficult to find naturally occurring materials that display a usable electronic response at THz frequencies. This deficiency is often referred to in the industry as the "THz gap", and so far only moderate progress has been made in THz generation, detection, and manipulation. Considering the prominent potential applications of THz radiation, further improvements are necessary in developing THz devices by using novel materials.

A new type of artificial electromagnetic composites termed metamaterials have been developed in recent years. These new materials have yielded a number of phenomena not achievable with natural materials, including negative refractive index and cloaking. Composite metamaterial elements with sub-wavelength scale of about ($\lambda_0/10$), such as split ring resonators (SRRs), are patterned in a periodic array to form metamaterials. Thus metamaterials can be considered as an effective medium and are well described by magnetic permeability μ(ω) and/or electric permittivity $\in(\omega)$, in accordance with the macroscopic form of Maxwell's equations. Metamaterials are easily fabricated for response in the microwave regime, including three dimensional (3-D) structures, owing to the relatively large unit cell size (~1 cm) and smallest required feature size (~1 mm). With modest effort metamaterials have been extended to THz frequencies. Planar THz electric and magnetic metamaterial elements have typical lateral dimensions of ~30 μm and are often fabricated upon substrates with dielectric constant ranging from 8-15 $\in_0$.

Figure 35:
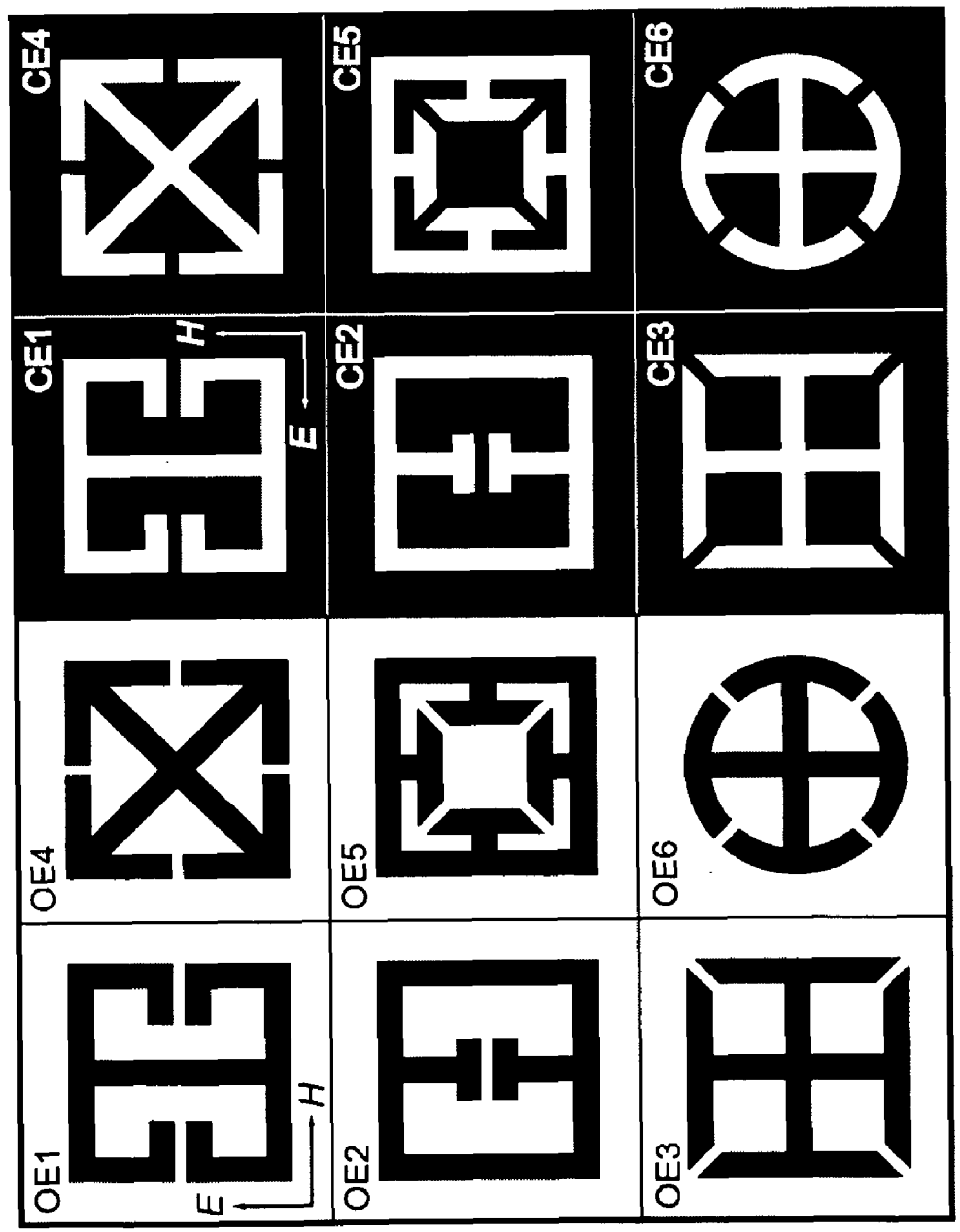
FIG. 35 is schematics of twelve example planar metamaterial unit cells (elements) according to an aspect of the present invention, showing original and complementary versions of each pattern.

FIG. 35 illustrates geometry of original planar metamaterial unit cells (OE1-OE6) and their complements (CE1-CE6) with dimensions described in the text. The polarization of normally incident THz radiation is configured as shown in OE1 and CE1 for the original and complementary metamaterials, respectively.

In this aspect of the invention results of experimental and computational studies are presented on planar THz eSRR metamaterials and their corresponding inverse structures where the metallic patterns are replaced with open areas and open areas are replaced with metallic conducting regions (see complementary structures of FIG. 35). The terminology "original" is adopted herein to refer to the eSRR metamaterial structures and "complementary" to refer to the corresponding inverse metamaterial structures.

Original electric metamaterials reveal a resonant decrease in transmission ($T(\omega)$) characteristic of a Lorentz-like effective permittivity with resonant frequency $\omega_0$. Off resonance, they yield relatively high values of $T(\omega)$. In contrast, the complementary metamaterials display a resonantly enhanced $T(\omega)$. The permittivity in this case is the sum of an effective Drude-like response (with an effective plasma frequency $\omega_{cp}$) associated with the interconnected metallic regions and a Lorentz-like oscillator with resonant frequency $\omega_{c0}$. The enhanced transmission occurs near $\omega_{cp}$ but below $\omega_{c0}$. Results are also presented for numerical simulations of the local electric field and surface current density, (both on resonance), which provide additional insight into the origin of the electromagnetic response of the original and complementary metamaterial structures.

The complementary transmissive properties of these metamaterials are consistent with Babinet's principle, and provide a foundational understanding useful in the construction of functional THz devices. Such metamaterials may be of particular interest in applications such as FIR spectroscopy, astronomy, laser cavity output couplers, and Fabry-Perot interferometers. In consideration of the critical dependence of devices on materials for use in the mm-wave, THz and infrared frequency regimes, the design flexibility associated with metamaterials offers considerable advantages in construction of low loss, state-of-the-art, high performance frequency agile devices. This is expected to be especially important where conventional designs of FIR filters or frequency selective surface using metallic grids and meshes, or other similar structures, are not ideal. Recently, both optical and electrical methods have demonstrated switching of THz radiation utilizing metamaterial elements thus evincing the versatile and functional electromagnetic response that these exotic artificial structures afford.

4.2 Sample Design and Experimental Technique

The metamaterial structures employed in this work are based upon an electric analogue to the split-ring resonators. Example embodiments of the unit cell geometries and notations are shown in FIG. 35, with example elements labeled as $E_n$ where n ∈ {1-6} for different samples. A prefix of either "O" or "C" is attached to indicates whether the structure is Original or a Complementary structure. These highly symmetric structures consist of a class of sub-wavelength elements that exhibit a resonant response to the electric field while minimizing or eliminating any response to the magnetic field. To simplify description and comparisons, all of these structure embodiments are shown configured with an outer dimension of 36 μm, a lattice parameter of 50 μm, line width of 4 μm, and a gap of 2 μm. It should be appreciated that different sizes and geometries can be designed according to the teaching herein without departing from the present invention. In the example embodiments, both the original structures and their complements are fabricated as square planar arrays on substrates, such as comprising semi-insulating gallium arsenide (Si—GaAs) substrates of 625 μm thickness. Conventional photolithographic methods are used for patterning the planar metamaterial structures, which consist of 200 nm of gold with 10 nm of titanium for adhesion to the substrate.

Terahertz time-domain spectroscopy (THz-TDS) is utilized herein for characterizing the electromagnetic responses of these electric metamaterials. The photoconductive THz-TDS test system has been detailed elsewhere. The test setup includes a polyethylene lens to focus the linearly polarized THz beam onto the metamaterial sample to a diameter of about 3 mm and a second polyethylene lens to recollimate the transmitted THz beam back to a photoconductive receiver. For simplicity, these tests were performed at room temperature in a dry air atmosphere.

Figure 36:
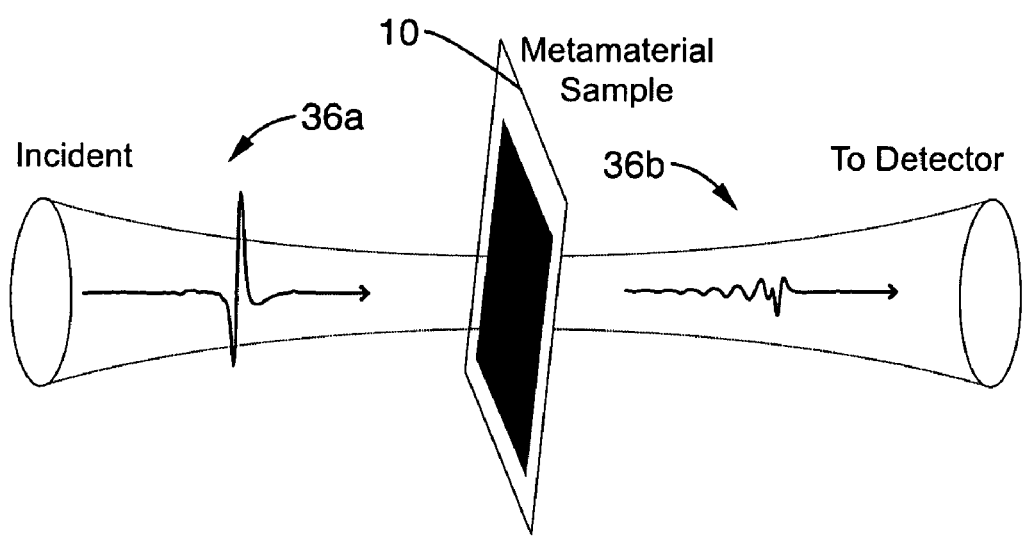
FIG. 36 is a schematic of a test configuration for measurements of THz transmission according to an aspect of the present invention.
Figure 37:
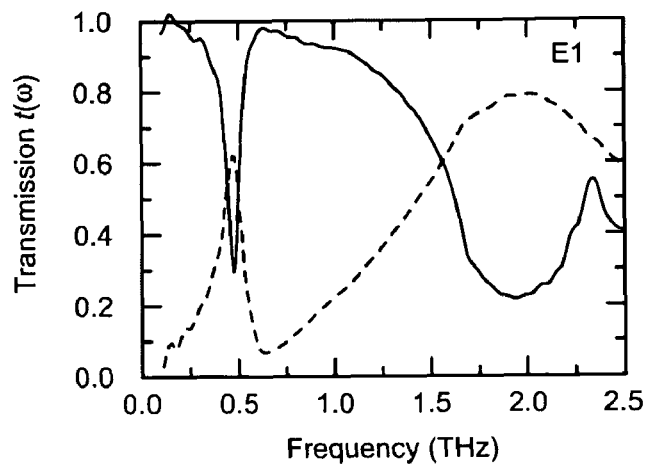
FIG. 37-42 are graphs characterizing frequency dependent THz transmission coefficients for original and complementary metamaterials OE1 and CE1 according to an aspect of the present invention.
Figure 38:
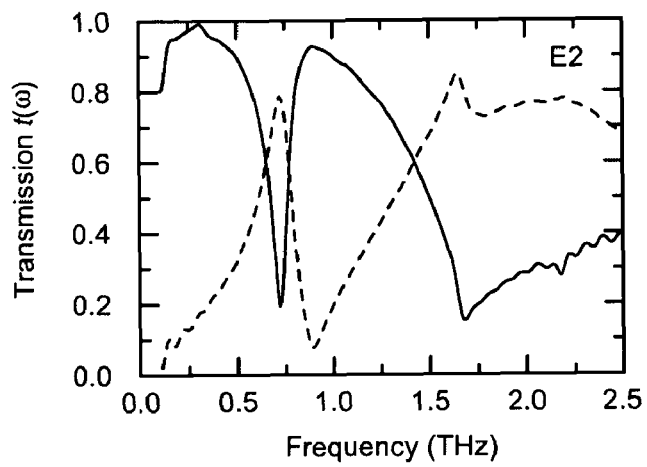
Figure 39:
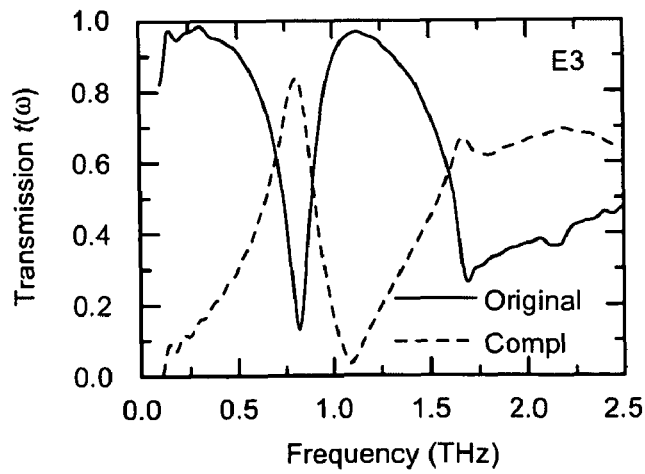
Figure 40:
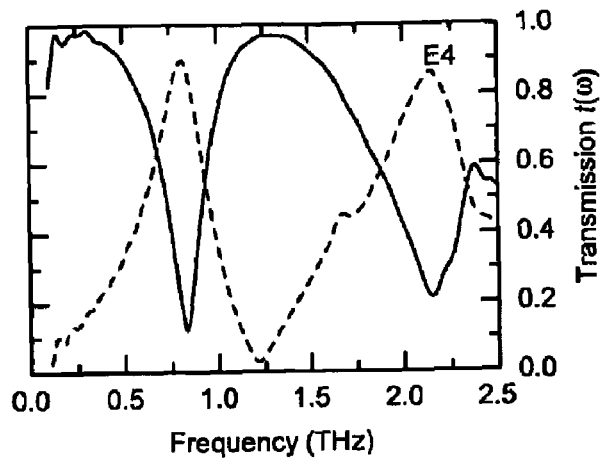
Figure 41:
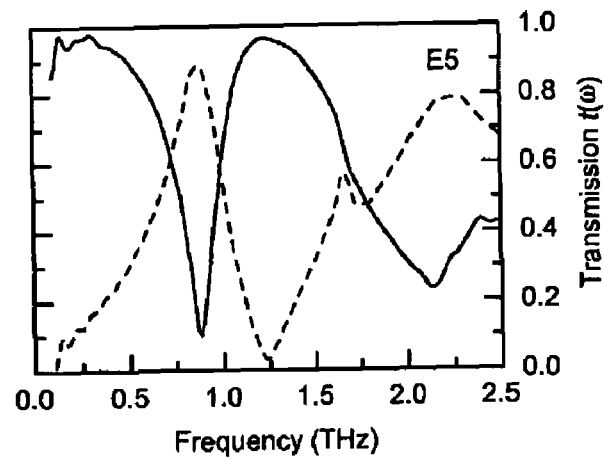
Figure 42:
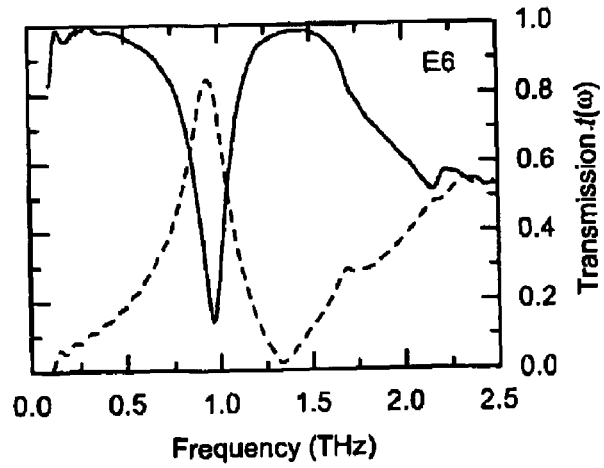
Figure 43:
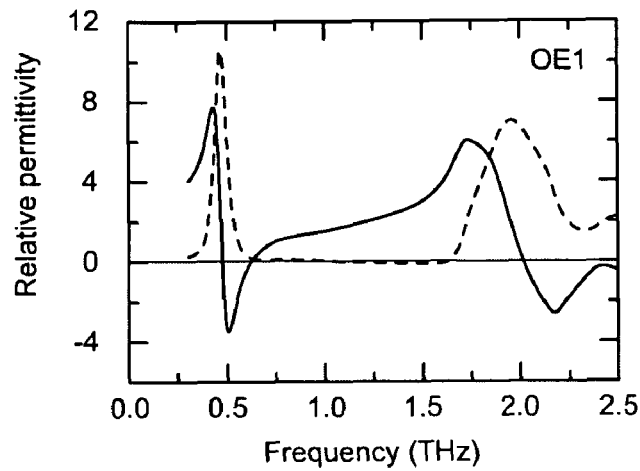
FIG. 43-48 are graphs characterizing dielectric function for each of the original metamaterials according to an aspect of the present invention.
Figure 44:
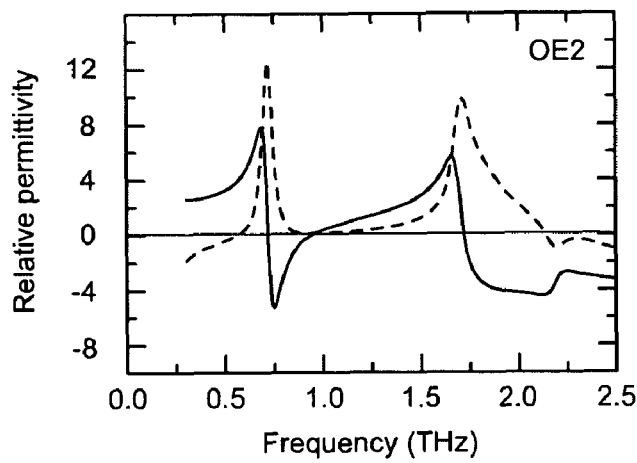
Figure 45:
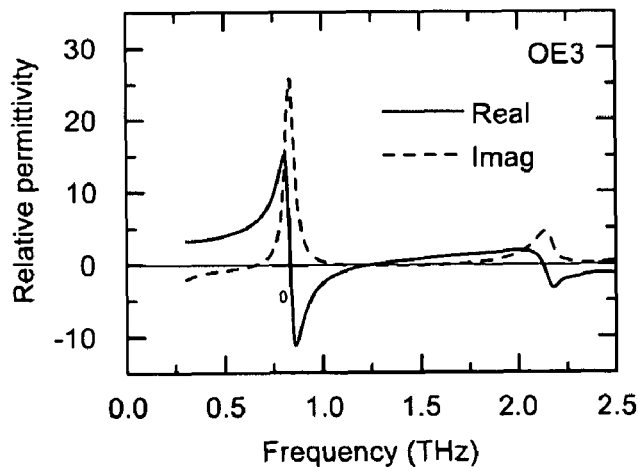
Figure 46:
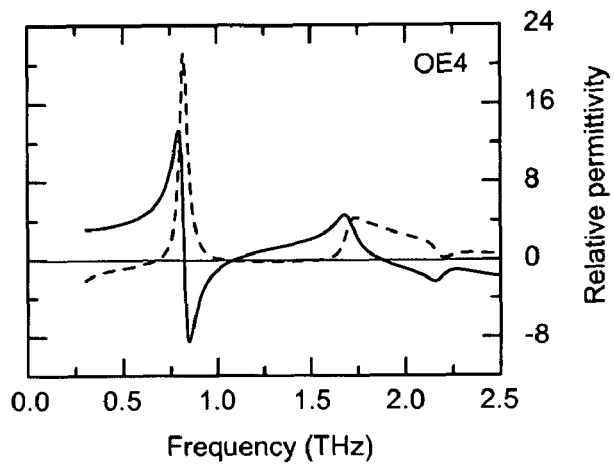
Figure 47:
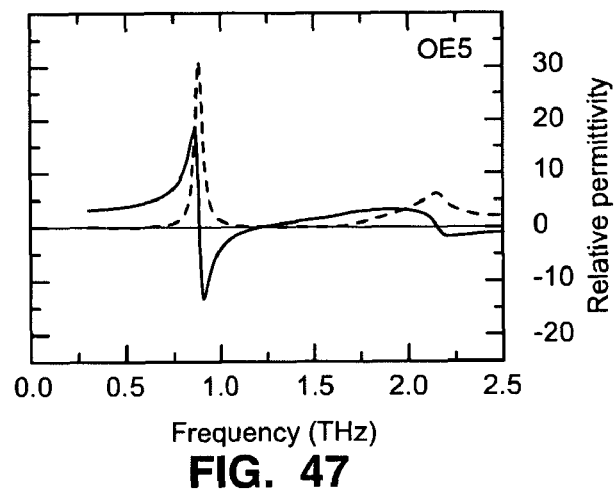
Figure 48:
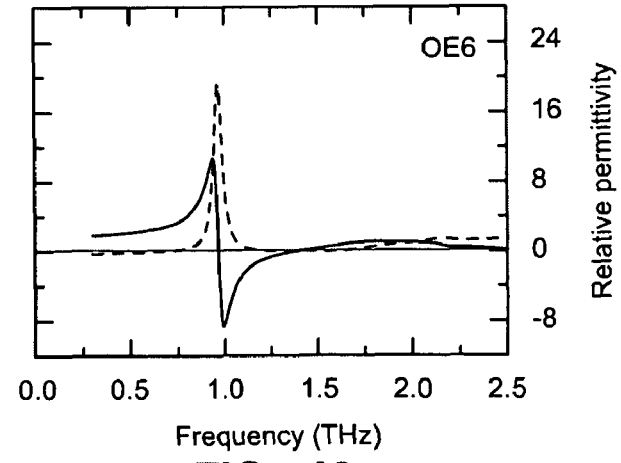
Figure 49:
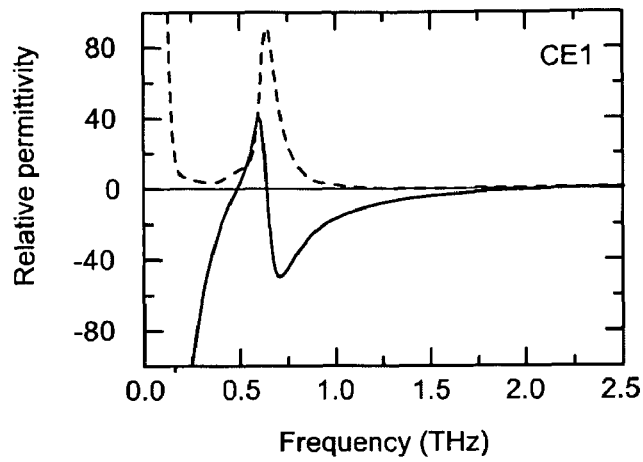
FIG. 49-54 are graphs characterizing dielectric function for each of the complementary metamaterials according to an aspect of the present invention.
Figure 50:
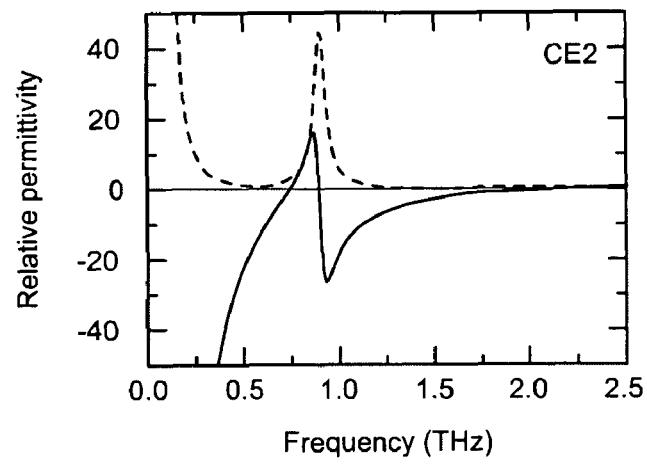
Figure 51:
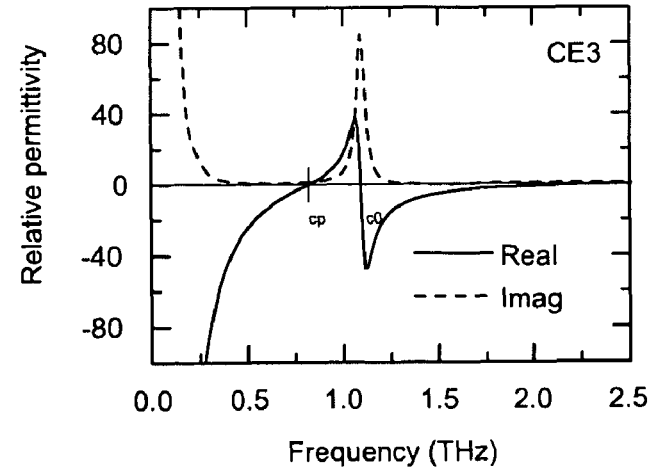
Figure 52:
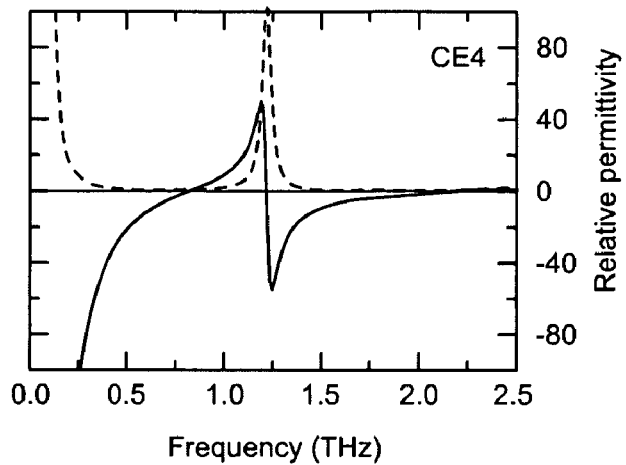
Figure 53:
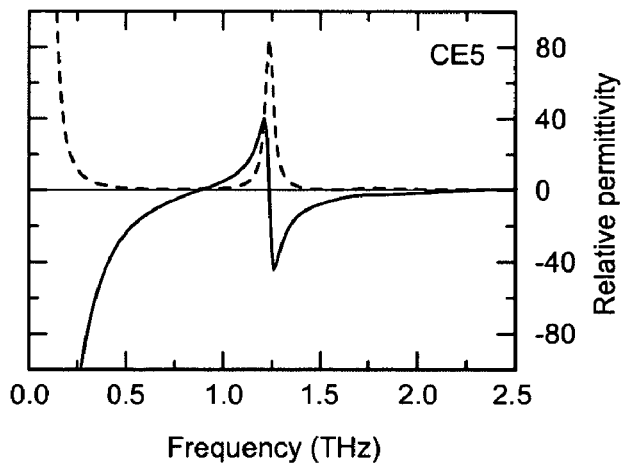
Figure 54:
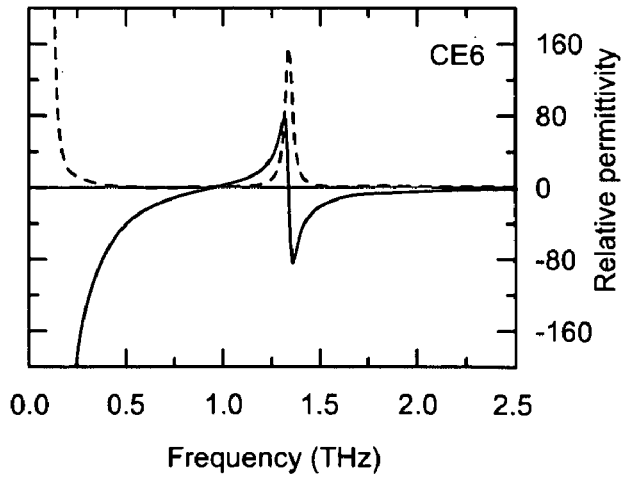

FIG. 36 illustrates schematically the time-varying (time domain) electric field of the impulsive THz radiation with normal incidence being measured in transmission ($E_{sam}(t)$) through the metamaterial sample, and a second measurement ($E_{ref}(t)$) is herein performed through a suitable reference which, in the present case, is a bare Si—GaAs substrate of the same thickness and refractive index 3.6 as the substrate upon which the metamaterials are fabricated. After Fourier transformation of the THz time-domain data, the frequency dependent complex transmission coefficient of the planar metamaterials, $\tilde{t}(\omega)=t(\omega)e^{i\Phi(\omega)}=E_{sam}(\omega)/E_{ref}(\omega)$, is obtained from the transmitted THz spectrum of the sample divided by the reference spectrum. From $\tilde{t}(\omega)$, the frequency dependent complex optical constants are determined through numerical inversion of the Fresnel equations. The description of this aspect of the invention largely focuses on the frequency dependent complex effective dielectric function, $\tilde{\in}(\omega)=\in_1(\omega)+i\in_2(\omega)$ as an appropriate description of the electromagnetic response of the original and complementary electric metamaterials.

4.3 Complementary THz Transmission

With normally incident THz radiation (i.e., the electric and magnetic field is in-plane with the metamaterial structures), the polarization is configured in accordance with the dual sources in Babinet's principle as shown in FIG. 35. The original metamaterial is illuminated by the incident field ($E_0$, $H_0$) and its complement is illuminated by the incident field ($E_{0c}$, $H_{0c}$). For the free-standing planar metamaterials and their complements (neglecting the GaAs substrate) consisting of perfectly conducting and infinitely thin metal films, where Babinet's principle applies, the two incident fields are duals of each other when $E_0 = Z_0 H_{0c}$, $H_0 = -E_{0c}/Z_0$, where $Z_0 = (\mu_0/\in_0)^{1/2}$ is the impedance of free-space. This amounts to a 90° rotation of the field around the propagation axis, as detailed in OE1 and CE1 of FIG. 35. The transmitted field should satisfy the following relations:

$$E_c - Z_0 H = E_{0c}, \quad H_c + E/Z_0 = H_{0c}, \quad (1)$$

where (E, H) is the transmitted field of the original metamaterial, and ($E_c$, $H_c$) is the transmitted field of its complement. This means that, if the polarizations of the THz sources are dual, the field transmission coefficients of the original and complementary planar metamaterials should satisfy:

$$t(\omega) + t_c(\omega) = 1. \quad (2)$$

As will be shown, THz transmission results through the planar metamaterials demonstrate good agreement with Babinet's principle and Eq. (2) despite the presence of the supporting GaAs substrate. In measurements the complementary samples were rotated (with respect to the orientation of the original structures) by 90° with the THz polarization fixed. However, this rotation is only required for the OE1, OE2 and CE1, CE2 samples, as these structures lack $\pi/2$ rotational symmetry.

FIG. 37 through FIG. 42 depict the frequency dependent THz electric field transmission coefficients of the original (upper curves) and complementary (lower curves) metamaterials for elements patterns OE1-OE6. The field configuration of the THz radiation is shown in OE1 (CE1) of FIG. 1 for the original (complementary) metamaterials. First, the low frequency resonant response (<1 THz) that is present in all metamaterials is considered. This resonance originates from circulating currents in the ring (anti-ring) structures and results in a pure electric response as counter-circulating currents in each unit cell eliminate any magnetoelectric response. All original metamaterials show a resonant transmission decrease at frequencies between 0.5 THz and 1.0 THz with $t(\omega)$ values as low as 10%. The complementary metamaterials, on the other hand, show a resonant enhanced transmission as high as 90% at the same frequencies as in the original metamaterials. Furthermore, the frequency dependent transmitted THz electric field amplitude of the original and complementary metamaterials in substantially satisfy the relation shown in Eq. (2), where the small discrepancies are mostly due to the finite thickness and non-ideal conductivity of the metal structures in addition to the fact that these structures are not free standing. The effects of the asymmetry, introduced by the substrate, if they exist, would be corrected by the fact that it is used with both original and complementary structures and additionally is used to reference all measurements.

In addition to the low frequency resonant response, there is a second transmission minimum (original metamaterials) or maximum (complementary metamaterials), which originates from the excitation of electric dipoles similar to that in cut wires or their complements. For these higher frequency resonances, the dimension of the unit cell is on the order of half wavelength of THz wave in GaAs (refractive index 3.6) meaning that the structures are no longer in the effective medium limit. Therefore, the focus in the remainder of this section is on the lower frequency resonant response which can be described in the effective medium limit.

Here it should be emphasized that the enhanced resonant transmission in the complementary metamaterials is due purely to the electric response. It has been found during our tests that the normal incidence of the THz radiation ensures that the electric and magnetic fields are configured to be completely in-plane, which indicates that there is no component of the magnetic field capable of causing a magnetic response by driving circulating currents. Thus, only an electric resonant response is obtained, in accordance with previous results on electric metamaterials and the simulation results shown in the following section.

4.4 Numerical Simulations

The design of the original and complementary planar metamaterial structures (with the aforementioned counter-circulating currents) and the field configuration in these THz transmission tests suggest that the THz resonant transmission is, as described, purely an electric response. In order to further elucidate the nature of the resonances observed in transmission, numerical simulations have been performed for the original and complementary metamaterials using commercially available finite element modeling software. The THz transmission simulations (not shown) are in excellent agreement with the results shown in FIG. 37 through FIG. 42; therefore the simulation results can be used to interpret the origin of the resonances.

To discern surface current density and electric field norms for the original and complementary metamaterials simulations were performed and plotted at the low lying resonance frequencies (not shown). It was found that for the original structures the incident THz field drives circulating surface currents in the inductive loops resulting in charge accumulation at the capacitive split gaps. Thus, in the vicinity of the gaps the electric field is resonantly enhanced. The simulations revealed that the electric metamaterial structures have counter-circulating currents in the loops which cancels the electrically driven magnetic dipoles (oriented normal to the metamaterial plane) which would otherwise result in a magnetoelectric response as occurs in conventional SRRs. That is, these structures are not bianisotropic.

Similarly, in the complementary metamaterial structures with the polarization configured as shown in CE1 of FIG. 35, the incident THz field drives circulating currents in the inductive surrounding metal, and charge is accumulated at various regions of the capacitive anti-rings. As above, the in-plane THz electric and magnetic field does not excite a net magnetic dipole moment. Thus, the complementary metamaterials are also purely electric displaying neither a magnetic nor magnetoelectric response. In comparing simulation results for the original and complementary structures it was found that the regions of the original structures in which a high surface current density exists, that the complementary structures display a large local electric field. Similarly, the resonantly enhanced electric field at the capacitive gaps of the original structures corresponds to regions of high surface current density in the complementary structures. These results fully illustrate the dual nature of the current and electric field when comparing the original and complementary structures.

4.5 Dielectric Function

According to the above discussion coupled with the simulation results, the THz transmission of the original and complementary structures arises from a purely electric resonant response. Thus, the planar THz metamaterials and their complements, in the effective medium approximation, can be described by a frequency dependent complex dielectric function, $\tilde{\epsilon}(\omega)=\epsilon_1(\omega)+i\epsilon_2(\omega)$ which is derived from the experimentally determined frequency dependent complex transmission coefficient, $\tilde{t}(\omega)=t(\omega)e^{i\phi(\omega)}$. This is accomplished through numerical inversion of the Fresnel equations (with the permeability correctly set to unity) and assuming a cubic unit cell.

FIG. 43-48 and FIG. 49-54 illustrate results for the original and complementary metamaterials, respectively, assuming a cubic unit cell. The curves show the real and imaginary parts of the complex dielectric function. In the original electric metamaterials the complex dielectric function shows a Lorentz-like resonant dispersion at the lower lying resonant frequencies, in accordance with the transmission data shown in FIG. 37-42. This dispersion originates from the THz driven circulating currents accompanying charge accumulation, which creates a resonance due to the introduction of loop inductance L and gap capacitance C of the metamaterial particles. Over a narrow range on the high frequency side of the resonance the real part of the dielectric function is negative. It was also noticed that the imaginary part of the dielectric function in samples OE2, OE3 and OE4 turns negative at low frequencies. This is physically unrealistic and most likely results from the imperfect procedure for extraction of the dielectric function, which depends on the comparison of the metamaterial spectra to that of the bare GaAs substrate. The use of a bare sample as a spectral reference is generally valid for spectroscopy of homogeneous samples and permits the cancellation of any of the effects of the underlying substrate, such as Fresnel losses from the back face. However, the procedure relies on a well defined boundary between the sample and substrate. Since this is only an approximation for the metamaterials, it is not unreasonable to observe anomalous behavior over small spectral regions.

In the complementary metamaterials, an effective Drude response arising from the interconnected metallic regions occurs at low frequencies, as shown in FIG. 49 through 54. The real part of the complex dielectric function shows large negative values, while the imaginary part shows large positive values indicating a lossy medium at these frequencies. Similar to the original metamaterials, the complex dielectric function of the complementary metamaterials also shows a Lorentz-like resonant dispersion. Over a small frequency range the real part of the dielectric function shows positive values. Again this originates from the THz driven circulating currents on the metal surface surrounding the open structures (anti-rings), where the surrounding metal is inductive with higher surface current density, and the various regions of the open structure provide capacitance with higher electric field enhancement.

It is noted that the resonance frequency, $\omega_0$, of the original metamaterial occurs at the lower frequency crossing, $\omega_{cp}$, of the complementary metamaterial, as indicated in FIGS. 43 through 54. The high transmission maxima of the complementary metamaterials shown in FIGS. 37 through 42 occur near $\omega_{cp}$ where the real part of the complex dielectric function crosses one.

4.6 Observations

A series of novel planar electric metamaterials and their complements which are resonant at THz frequencies have been designed, modeled, and characterized according to this aspect of the invention. These metamaterial structures show complementary transmission properties as characterized by THz time domain spectroscopy, consistent with Babinet's principle. The highly symmetric structures and finite element modeling simulations elucidate the origin of the resonance, which is purely due to the electric response of the metamaterials. THz time domain data permits the extraction of the frequency dependent complex dielectric function, which shows negative values in the original metamaterials and positive values in the complementary metamaterials over a narrow frequency range. While the Lorentz-like resonant permittivity describes the THz transmission dips in the original metamaterials, it modifies the effective Drude response of the complementary metamaterials. Thus for the complementary metamaterials, the result is a combination of the Drude and Lorentz responses, which culminates in the real part of the dielectric function crossing one at the same frequency of the Lorentz oscillator of the original structure. This explains why the transmission minimum of the original metamaterial and the transmission maximum of the complementary metamaterial occur at the same frequency. These novel metamaterial structures will be of potential use in the construction of functional devices operating at THz frequencies.

5. Ultrafast Optical Switching of Terahertz Metamaterials

Optical switching of electrically resonant terahertz planar metamaterials fabricated on ErAs/GaAs nanoisland superlattice substrates is taught and demonstrated in this section. The use of photoexcited charge carriers in the superlattice shunt the capacitive regions of the constituent elements, thereby modulating the resonant response of the metamaterials. A switching recovery time of 20 ps results from fast carrier recombination in the ErAs/GaAs superlattice substrates.

Metamaterials consisting of periodically patterned split ring resonators (SRRs) display a strong resonant electromagnetic response. Importantly, the resonant frequency scales with the SRR dimensions. This characteristic is of particular importance for the terahertz (1 THz=$10^{12}$ Hz) regime, where naturally occurring materials rarely have a useful electronic or photonic response. Recently, it has been shown that the resonance strength, and hence the transmission, can be controlled via external stimuli for planar metamaterials fabricated on semiconducting substrates. This has resulted in efficient switching and modulation of freely propagating THz radiation, which is essential for many potential applications such as secure short-range communication.

Switching/modulation of THz radiation with an applied voltage was recently demonstrated using a hybrid structure consisting of a Schottky diode and a planar metamaterial array. An external voltage controlled the conductivity of the semiconducting substrate at the capacitive split gaps, thereby modulating the metamaterial resonance strength. Owing to the large capacitance and series resistance, the device operates at a low switching/modulation rate (up to ~10 kHz). An optically based approach has also been demonstrated where photoexcitation of free charge carriers in the semiconducting substrate shunts the metamaterial resonance. The advantage of the optical approach is the possibility of extremely fast switching using femtosecond optical pulses. In this case, although the switching rise time can be very fast, the recovery time must also be minimized to achieve high bit rate modulation. For intrinsic GaAs this recovery time is of the order of nanoseconds due to carrier recombination. In this section ultrafast switching of THz metamaterial with recovery time as short as 20 ps through engineering the substrate carrier lifetime using molecular beam epitaxy grown ErAs/GaAs superlattices is demonstrated.

The recent progress in THz switching and modulation is noted based on one-dimensional photonic crystals using GaAs as a defect layer. Switching is achieved through photogeneration of carriers in GaAs, with a demonstrated switching time of approximately 100 ps limited by the carrier recombination time.

Various methods to shorten the carrier lifetime in semiconductors have been employed including radiation damage and low-temperature growth to introduce defects. By way of example and not limitation a ErAs/GaAs superlattice structure is grown by molecular beam epitaxy on an intrinsic GaAs wafer. It should be appreciated that in the ErAs/GaAs superlattice structure, the carrier lifetime is strongly correlated with the period L.

Figure 55:
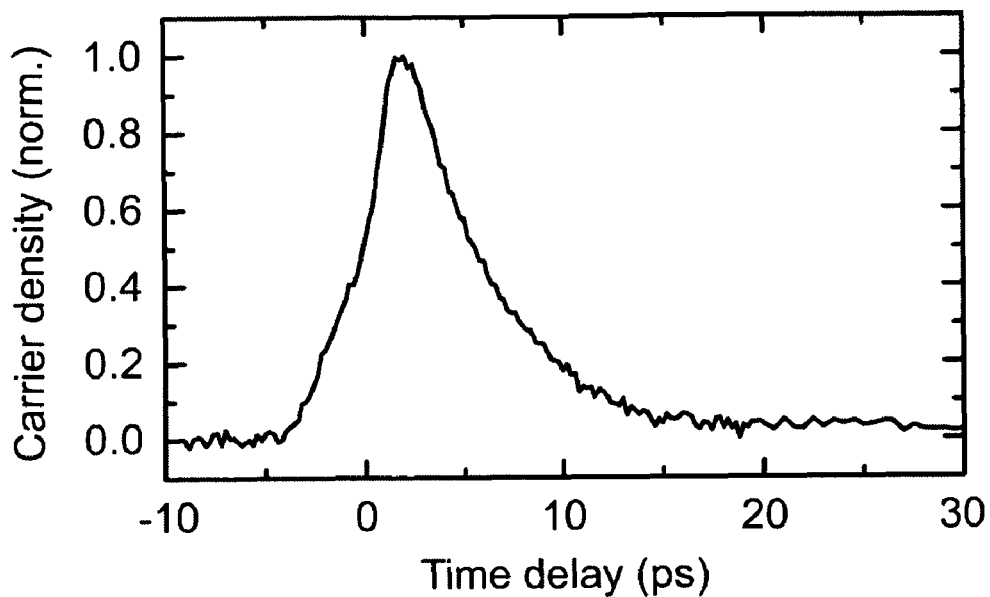
FIG. 55 is a graph of time dependence of normalized carrier density in response to photoexcitation according to an aspect of the present invention.

FIG. 55 depicts time dependence of normalized carrier density following photoexcitation of the ErAs/GaAs superlattice. In this section an embodiment is described having 20 periods with L=100 nm ErAs/GaAs superlattice which results in a carrier lifetime of approximately 10 ps. The lifetime is determined using optical-pump THz-probe spectroscopy.

Figure 56:
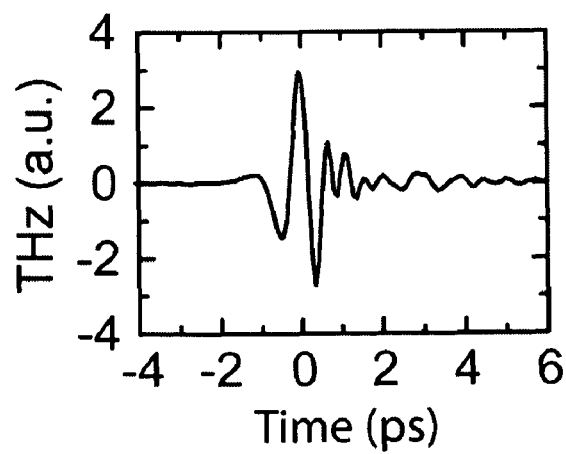
FIG. 56 is a graph of impulsive THz time dependence of normalized carrier density in response to photoexcitation according to an aspect of the present invention.

FIG. 56 illustrates impulsive THz electric field time-domain waveform that probes the pump-induced changes in the metamaterial response, which shows that carrier lifetime is ideal to demonstrate ultrafast switching of THz metamaterials due to the picosecond duration of the THz pulses.

Figure 57:
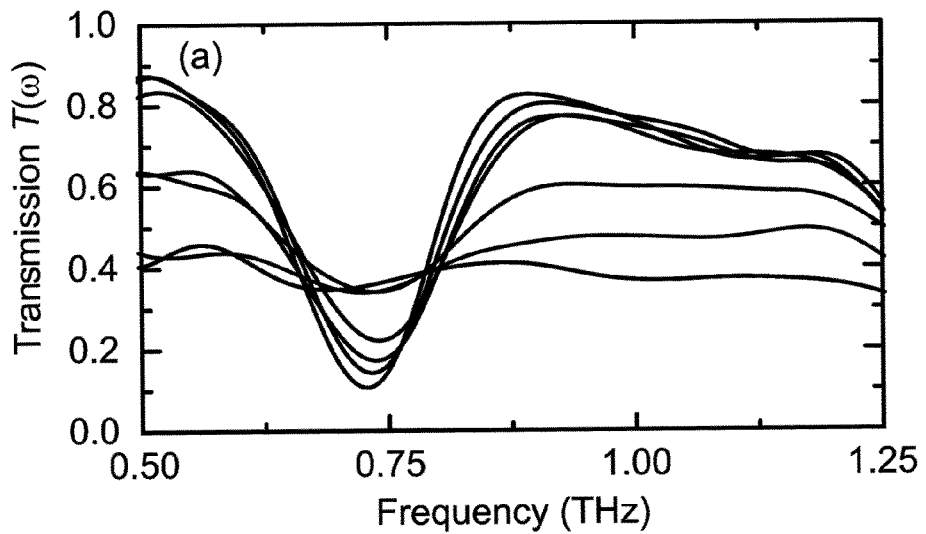
FIG. 57-58 are graphs of frequency-dependent transmission and effective dielectric function for the original eSRR array in response to photoexcitation according to an aspect of the present invention, with an inset showing the MM pattern used and polarization of incident radiation.
Figure 58:
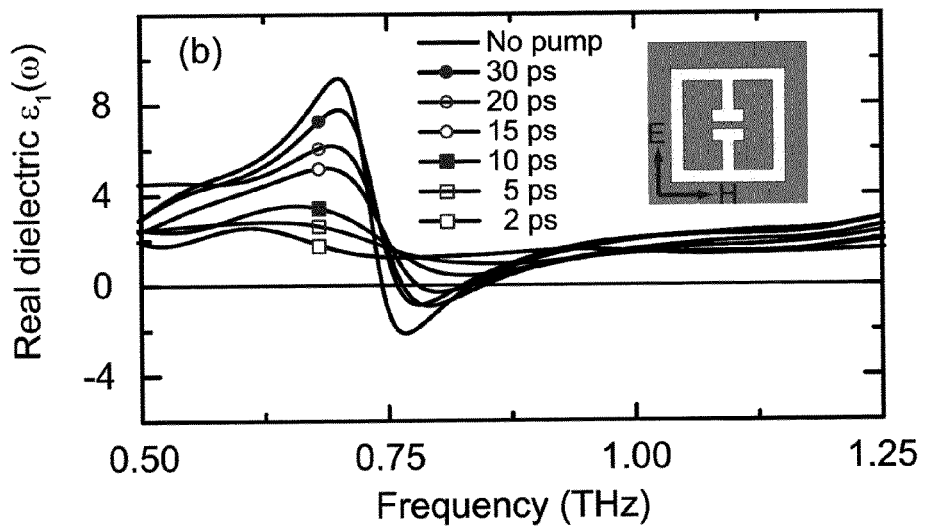
Figure 59:
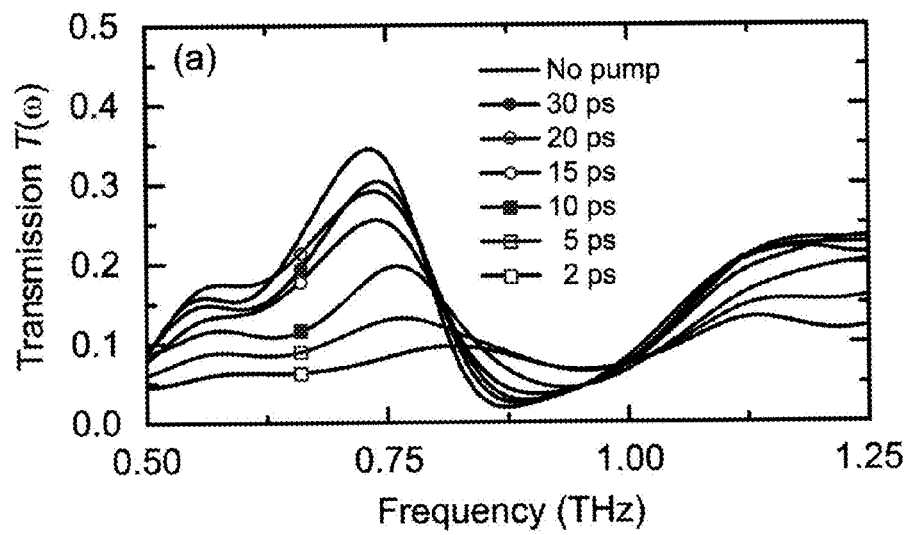
FIG. 59-60 are graphs of frequency-dependent transmission and effective dielectric function for the complementary eSRR array in response to photoexcitation according to an aspect of the present invention, with an inset showing the complementary MM pattern used and polarization of incident radiation.
Figure 60:
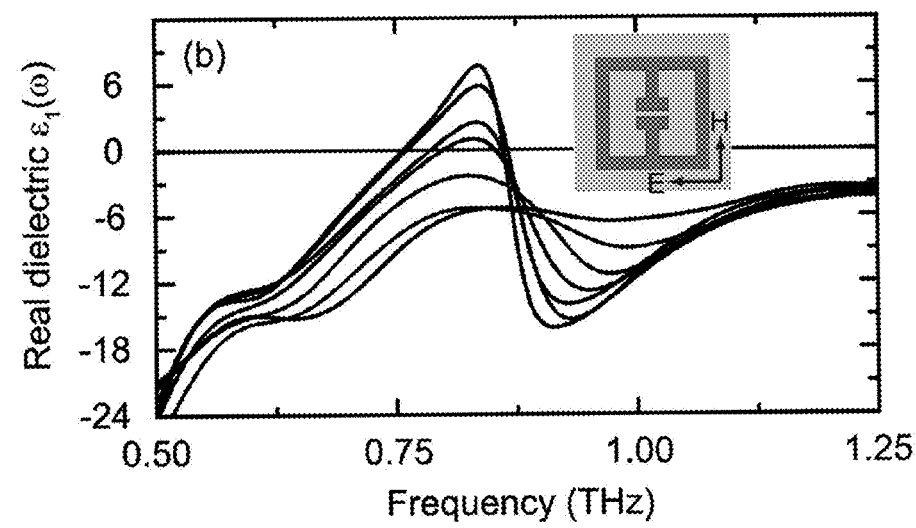

FIG. 57 through FIG. 60 depict electric metamaterials (introduced in prior sections) which are characterized here in response to photoexcitation. In FIG. 57 frequency-dependent transmission of the eSRR array at various times following photoexcitation is shown, while in FIG. 58 the corresponding real part of the effective dielectric function is depicted. The inset of FIG. 58 depicts a metamaterial eSRR unit cell, with arrows showing polarization of the normally incident THz radiation. In a similar manner FIG. 59 depicts frequency-dependent transmission of the complementary eSRR array at various times following photoexcitation, while in FIG. 60 the corresponding real part of the effective dielectric function is shown. The inset of FIG. 60 depicts a complementary metamaterial eSRR unit cell, with arrows showing polarization of the normally incident THz radiation.

The unit cells for these tests are illustrated in the insets to FIG. 58 and FIG. 60 for the original (OE2) and complementary (CE2) electric split ring resonators (eSRRs), respectively. These elements are periodically patterned on the ErAs/GaAs superlattice substrates using conventional photolithography with an electron-beam deposition of 10 nm of titanium for adhesion followed by 200 nm of gold. These metamaterials, in accordance with Babinet's principle, have shown complementary transmission properties, meaning that the transmission minimum in the OE2 sample corresponds to a transmission maximum in the CE2 sample, both characterized by a frequency-dependent permittivity $\in(\omega)$.

The optical-pump THz-probe test system has been utilized in the industry. The linearly polarized impulsive THz radiation is focused to about a 3 mm diameter spot onto the metamaterials at normal incidence, with the field polarization indicated in the insets. Synchronized femtosecond optical pulses with 100 fs pulse duration, 1 kHz repetition rate, and 800 nm center wavelength are expanded to about 8 mm diameter, larger than the THz focal spot, to excite free charge carriers in the ErAs/GaAs superlattice substrates. At various time delays between the arrival of THz pulses and optical excitation, the transmitted THz electric field transient is measured. A second measurement of the transmitted THz pulse through an ErAs/GaAs superlattice without the photoexcitation and the metamaterial serves as a reference. The frequency-dependent transmission of the metamaterial structure is obtained by dividing the Fourier transform of the sample scan by the Fourier transform of the reference scan. This is performed at each delay such that the temporal evolution of the frequency-domain metamaterial response can be determined. We purposely engineered the ErAs/GaAs superlattices to have a lifetime of approximately 10 ps to minimize artifacts that arise in the analysis when the sample response varies quickly in comparison with the THz pulse duration. However, ErAs/GaAs nanoisland superlattices can be engineered to have subpicosecond response times, making it possible, in principle, to have even faster switching and recovery times than what is demonstrated below.

It has been shown that a substrate carrier density of $10^{16}$ cm$^{-3}$ (corresponding to fluence of about 1 μJ/cm$^2$) is sufficient to shunt the resonant metamaterial response. The transmission changes of THz intensity in the composite metamaterial ErAs/GaAs structures are displayed in FIG. 57 and FIG. 59 for the original and complementary metamaterials, respectively. For OE2 (CE2), a strong resonant decrease (increase) occurs at 0.7 THz without photoexcitation. This pure electric resonant response (i.e., deriving from the effective permittivity $\in(\omega)$ critically depends on the capacitive split gaps. Photoexcitation of carriers in the substrates shunts this capacitance, thereby decreasing the resonant strength. The resonant transmission for both OE2 and CE2 is turned off within 2 ps. As the substrate carriers are trapped and recombine, the resonant transmission characteristics reappear. For the present devices, nearly complete recovery is achieved within 20 ps following photoexcitation. Importantly, the magnitude of the transmission changes are much larger in comparison with the bare superlattice substrates, which have a 10% decrease in the THz transmission from the Drude response of the photoexcited carriers, indicating the importance of the planar metamaterials that dominate the electromagnetic response.

Following a procedure described elsewhere the effective frequency-dependent complex dielectric function of the metamaterials is determined assuming a cubic unit cell. The real portion of the dielectric function is shown in FIG. 58 and FIG. 60 for the OE2 and CE2 metamaterials, respectively. Without photoexcitation, both display a Lorentz-like resonant response. For CE2 this is superimposed on a Drude-like response due to the interconnected topology of the metallization. Over a narrow frequency range the permittivity obtains negative (positive) values for the original (complementary) metamaterial. Photoexcitation shunts the Lorentz-like resonant response, thus switching the permittivity from negative (positive) values to positive (negative) values in the original (complementary) metamaterial.

The present approach is different from previously demonstrated THz waveform synthesis, in which the switching is accomplished during the THz pulse generation. The freely propagating THz waves are switched and modulated by modifying the resonance strength of the planar metamaterials. The engineered carrier lifetime in the ErAs/GaAs superlattice substrates provides an advantageous ultrafast switching recovery time. This would also be very useful in THz pulse shaping. In contrast, many other resonant switches have slow recovery time due to unavoidable thermal effects. For instance, a similar phenomenon arises in the ultrafast switching of the mid-infrared surface-plasmon resonance through photoinduction of an insulator-to-metal phase transition. However, it takes tens of nanoseconds to recover to the insulating phase. In the present approach metamaterials may simply be scaled to operate at other target frequency ranges, though to obtain a usable response the carrier density in the substrate must also be carefully considered. For applications such as short-range THz communication, the bit rate will, of course, be determined by the repetition rate of the optical pulses.

In summary, optical modification of the resonant response of metamaterials and appropriate engineering design of the supporting substrates enables construction of efficient THz functional devices such as THz switches and modulators. We have demonstrated ultrafast optical switching of the resonant response of THz metamaterials. A switching recovery of approximately 20 ps was demonstrated by engineering design of the carrier lifetime of the ErAs/GaAs superlattice substrates upon which the planar metamaterial arrays were constructed.

6. Surface Emission Terahertz QCL with MM Gates

Some of the most important improvements needed for Quantum Cascade Lasers (QCLs) operating at terahertz (THz) frequencies are related to (i) beam quality, and (ii) imperfect output impedance, both of which could be mitigated with surface emitting QCL structures.

In general, QCLs utilize nano spaced semiconducting layers to form quantum-wells in which the energy levels (and hence the output wavelength) can be chosen by modifying the thicknesses of the individual layers. Previously disclosed QCLs are edge emitting devices.

Figure 61:
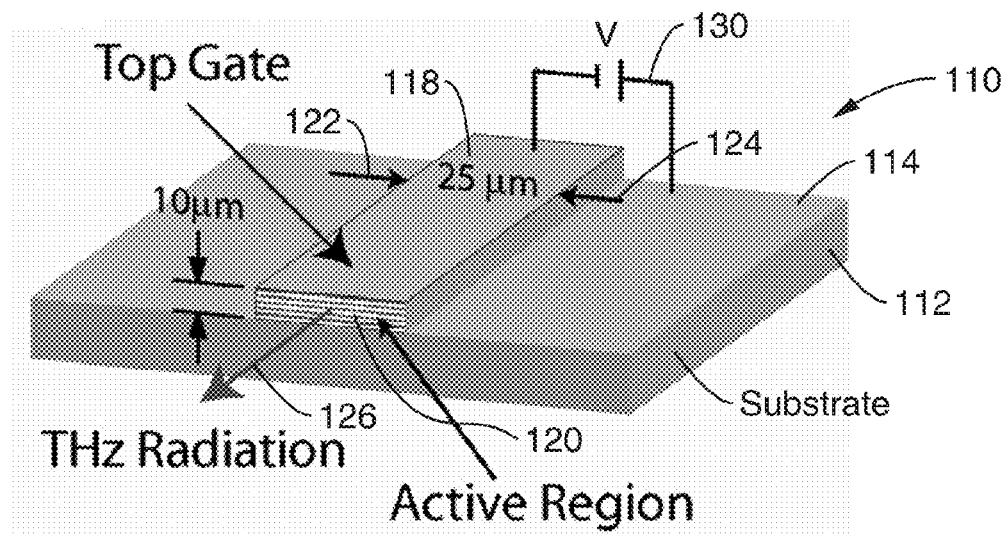
FIG. 61 is a schematic perspective view of a conventional side emitting QCL.

FIG. 61 illustrates an example of an edge emitting QCL, showing various aspects of a quantum cascade laser (QCL) 110 as follows. QCL 110 includes a bottom substrate 112 with an electroded top surface 114 upon which an active region 116 is positioned. An electroded top surface 118 is positioned over active region 116. In this arrangement, electroded surfaces 114, 118 are separated by active region 116 positioned therebetween. An electrical circuit 130 is coupled to electroded surfaces 114, 118 to provide a voltage across the active region 116 in a particular manner which causes active region 116 to emit radiation 126 from a side edge 120. This provides the laser emission from the overall edge emitting QCL 110, in the direction of the bolded arrow shown in the FIG. 61.

The active region 116 is typically about 10 µm thick, e.g. between electrodes 114, 118 by about 25 µm wide, such as between opposite transverse edges 122, 124 that are shown to run transverse (and in the particular embodiment shown perpendicular to) the laser emitting edge 120. This configuration results in an overall rectangular structure shown over bottom substrate 112, according to the particular illustrative embodiment shown in the figure. At these typical dimensions and arrangement, the emerging radiation is strongly divergent. This has been observed to lead to problems with beam quality, and imperfect output impedance.

FIG. 62 through FIG. 65 illustrate some characterization of metamaterials, discussed in previous sections, which allow for the fabrication of devices with an engineered electromagnetic response. These subwavelength conducting elements, such as shown by way of example in these figures can be used to individually access response to the electric and magnetic fields. Additionally, the dimensions of MMs can be changed permitting operation over many decades of frequency. Typical MM elements, as shown, resonate at THz frequencies and can be constructed from about 200 nm thick gold and have outer dimensions of about 36 µm, a line width of 4 µm and a gap of about 2 µm. Experimental results and simulation show a square array constructed of these MMs with a spacing of about 50 µm has a strong absorption to radiation at 480 GHz (top) and 730 GHz (lower). By electrically connecting the entire array of MMs they function as a grid which permits biasing of doped semiconductors thus allowing fabrication of Shottky diode structures.

Figure 62:
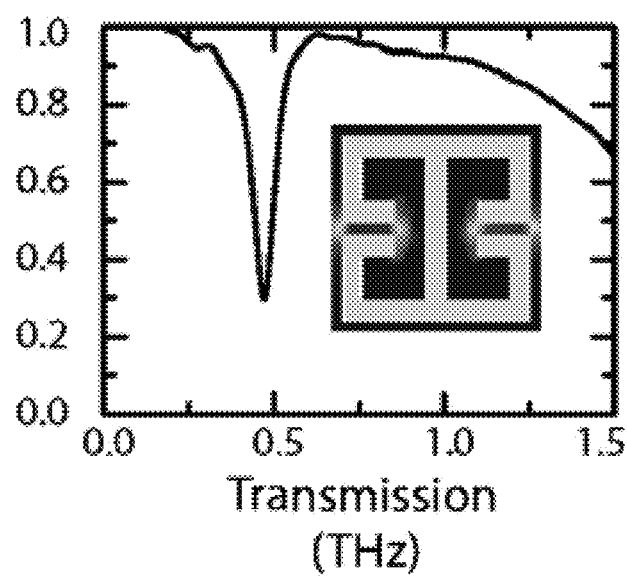
FIG. 62 is a graph of transmission characteristics for the MM pattern shown within the inset according to an aspect of the present invention.
Figure 63:
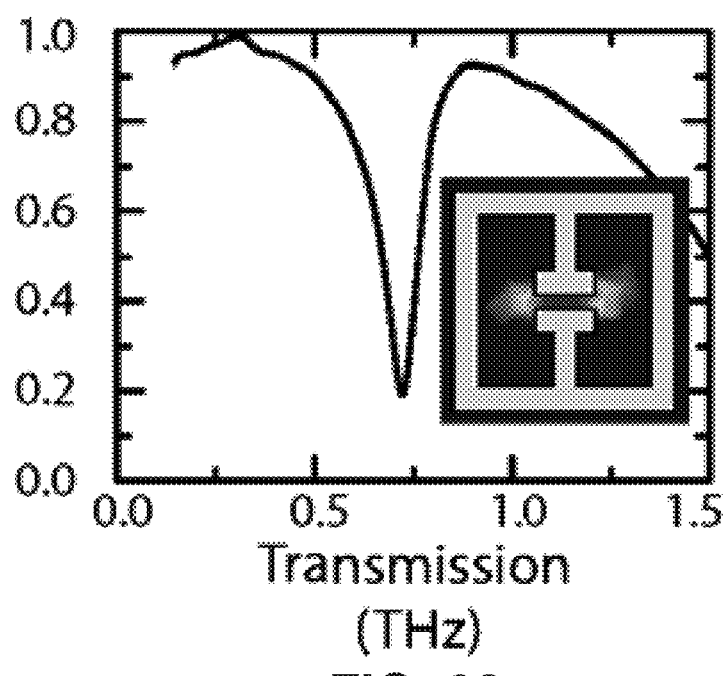
FIG. 63 is a graph of transmission characteristics for the MM pattern shown within the inset according to an aspect of the present invention.
Figure 64:
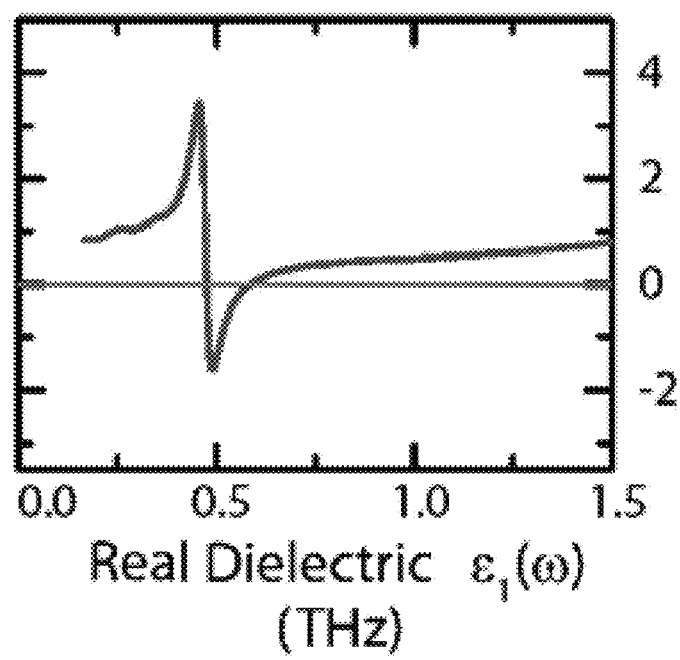
FIG. 64 is a graph of dielectric function for the MM pattern shown in FIG. 62.
Figure 65:
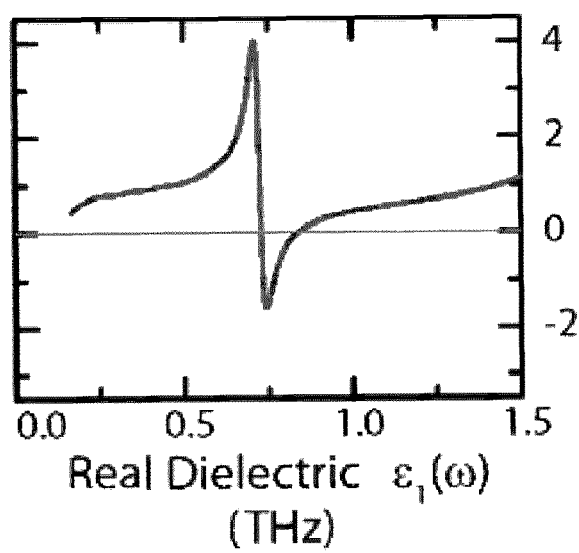
FIG. 65 is a graph of dielectric function for the MM pattern shown in FIG. 63.

Another type of MM based grid structure, such as in particular examples according to various embodiments provided hereunder, involves using the "inverse" (complement) of the elements shown in FIG. 62-63.

A well established "Babinet's" principle dictates that the "stop-band" provided by the MM structure should turn into a "pass-band" when modified according to the inverse structure shown in rectangular array form.

Figure 66:
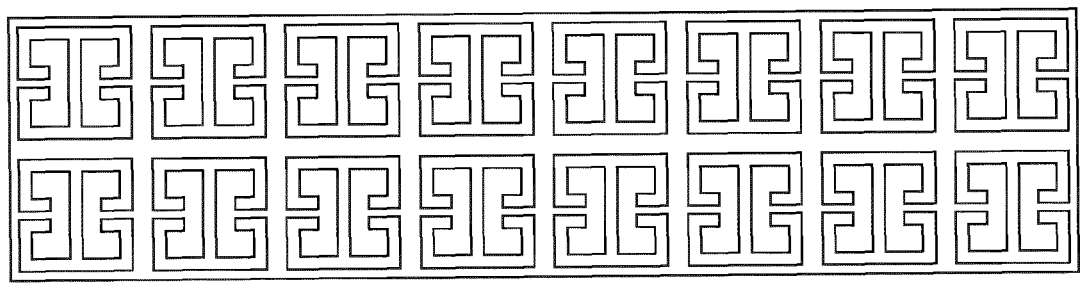
FIG. 66 is a schematic of an MM pattern array according to an aspect of the present invention.

FIG. 66 illustrates a small array of the inverse MM elements. According to one embodiment THz transmission windows are provided utilizing the MM array structure depicted in FIG. 66. Moreover, due to the large fraction of metal, these "inverse" MM structures are ideal as an array for the top grid layer of QCLs, owing to their pass-band properties and their high current carrying capacity. The MM grid depicted schematically in FIG. 66 is thus applied as a top gate array to a QCL, thus configuring the QCL to operate in surface emission (SE) mode. It is to be appreciated therefore that the present embodiments provide substantial benefit and utility by using metamaterials (MM) for top gated THz switches in a particular new and novel manner that results in QCL devices providing certain significant benefits not heretofore provided by prior devices.

Figure 67:
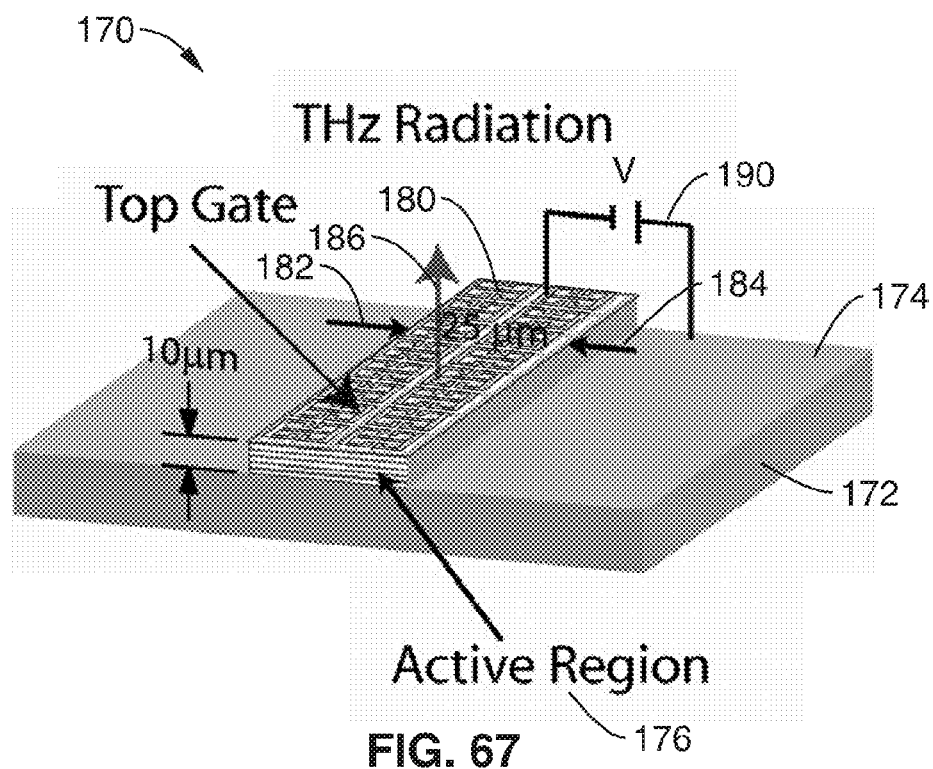
FIG. 67 is a schematic perspective view of a side emitting QCL incorporating the MM pattern of FIG. 66, according to an aspect of the present invention.

FIG. 67 illustrates an example embodiment of such an illustrative surface emitting quantum cascade laser (SE-QCL) 170 utilizing an MM top gate 180. By way of example, the active region 176 is about 10 µm thick, between electrodes 174, and MM surface 180, and about 25 µm wide, such as between opposite transverse edges 182, 184 SE-QCL 170 includes a bottom substrate 172 with an electroded top surface 174 upon which an active region 176 is positioned. The MM top gate 180 provides the electroded surface that is positioned over active region 176. In this arrangement, electroded surfaces 174, 180 are separated by the active region 176 positioned therebetween. An electrical circuit 190 is coupled to electroded surfaces 174, 180 to provide a voltage across the active region 176 in a particular manner which causes this active region to emit radiation.

However, by providing the top electrode to the structure as the "inverse" MM band-pass top gate 180 as shown and described, the radiation 186 passes through the MM and emits from the top surface 180 of the active region 176. This provides the laser emission from the overall SE-QCL 170, in the direction of the bolded arrow shown in the FIG. 67.

According to these present embodiments, such QCL devices may be readily fabricated, such as via Molecular Beam Epitaxy (MBE), and operated at THz frequencies utilizing MM top gates. As would be appreciated by one of ordinary skill upon a complete review of the entirety of the present disclosure, and in context of other available information, such MM top gated QCL structures may be readily adapted via ordinary experimentation with respect to gate size, impedance, beam shape, and conversion efficiency for particular applications and specific implementations pursued. Such adaptations may be further developed for example using theoretical and numerical simulations, in addition to ordinary experimental design.

Figure 68:
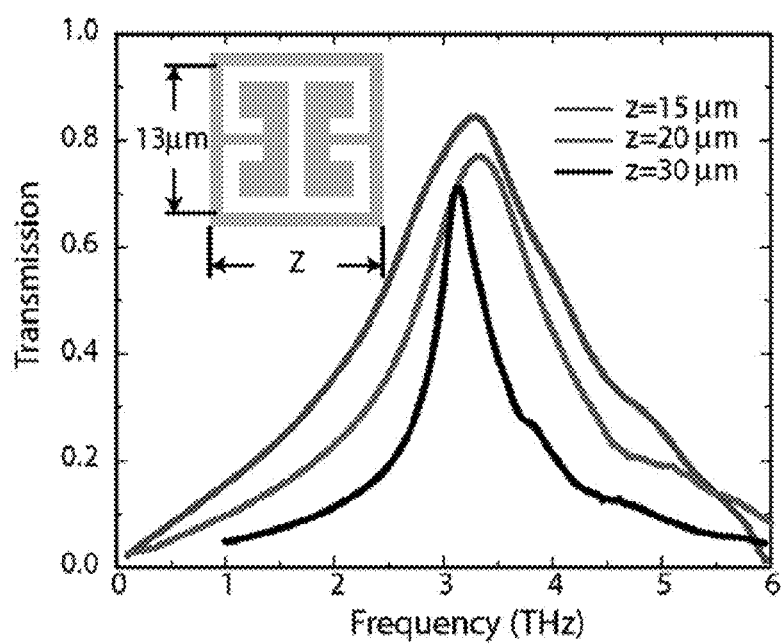
FIG. 68 is a graph of transmission simulation results according to an aspect of the present invention.

FIG. 68 depicts results from simulations performed according to the present embodiment of FIG. 67, such as with respect to an MM unit structure similar to that shown in array form in FIG. 66, and as shown in the schematic inset within FIG. 68. These simulations indicate a significant transmission at QCL frequencies. This simulation indicates that MMs can be used as a top gate for QCLs thereby allowing operation in surface emission (SE) mode, thus making significant advances towards solving the issues associated with prior edge emitting QCLs noted above, namely in beam quality, and imperfect output impedance.

The various benefits provided by the present embodiments include permitting QCL devices to be made larger, limited only by the fabrication quality and wafer size.

Figure 69:
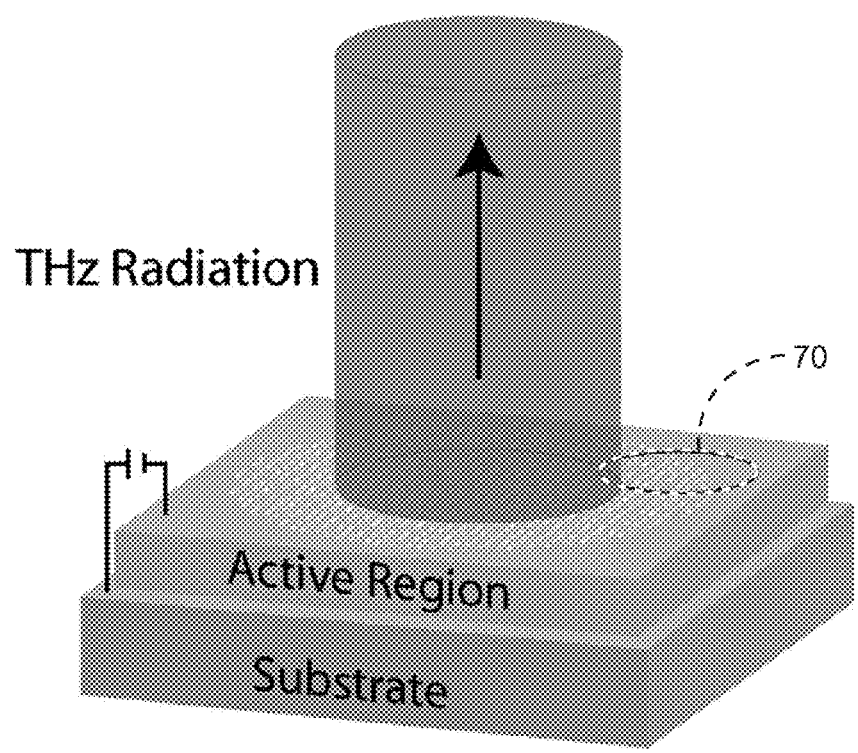
FIG. 69 is a schematic perspective view of an MM based QCL operating in surface emission mode according to an aspect of the present invention.
Figure 70:
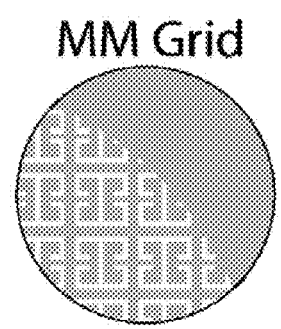
FIG. 70 is a schematic of a complementary MM array pattern incorporated within the surface emission QCL of FIG. 69.

FIGS. 69 and 70 illustrate an embodiment of QCL wafer fabrication. By way of example, FIG. 70 shows the MM pattern used in FIG. 66 and in the SE-QCL shown in FIG. 67, but in a planar array layout of FIG. 69 that provides the top gate MM for surface emission around a disk shape and thus rounded column of laser beam emission.

The most recent present embodiment provides particular benefit, as strong diffraction observed for beams in modern QCLs (at least as observed prior to the advent of the presently disclosed improvements) is due to the small size of the emission window (e.g., 10 µm×25 µm), such as shown at edge 20 in FIG. 61.

Another important consideration in QCLs involves their output impedance. Current state-of-the-art QCLs yield a 1% output due to the large mismatch of the device with free space. This severely limits the performance of QCLs and output powers are typically less than 5 mW. As mentioned, MMs allow a designed electromagnetic response, and thus the impedance of the gate can be carefully tuned to yield maximum output powers.

The various aspects, modes, and embodiments just described for MM top gated SE-QCLs are readily experimentally verified. For example, one approach first fabricates the active quantum well structures on a standard 4" wafer. A small portion of the wafer is used to fabricate a conventional QCL, for example a similar to the configuration shown in FIG. 61, operating near 3 THz. The exact output wavelength, power, tunability, and other key QCL parameters is determined using a Fourier transform spectrometer with a calibrated silicon bolometer. MM gate structures are then simulated to determine the proper dimensions needed for a THz window at the wavelength output of the QCL. Next a QCL with a design for example as shown in FIG. 61 is constructed with the exception that it utilizes a MM top gate, as in FIG. 67. The output wavelength, and power of the MM QCL operating in SE mode are readily characterized as above. Experimental characteristics are readily compared to simulation and the MM gate will be optimized for power output.

Notwithstanding the particular benefits of the specific embodiments provided hereunder, further verification and fundamental understanding of these novel SE-QCLs may be expanded upon by one of ordinary skill. In any case, the present disclosure represents a substantial advance over the existing state-of-the-art. A QCL operating in surface emission mode will allow the device to be made significantly larger thus permitting diffraction limited sized (or larger) lasers to be constructed, such as shown in FIG. 69. This would enable a more compact design and higher output power since lenses and other focusing mirrors are not required. MM top gates further provide the opportunity to spatially vary index of refraction over the transmission window. Thus output radiation can be controlled in any manner desired, without the need of external lenses and other focusing devices.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

TABLE 1

Characterization of Metamaterial Electric Response

| Name | $\omega_0$ (THz) | $\omega_p$ (THz) | min $\epsilon_1$ | $S = \omega_p^2/\omega_0^2$ | BW (%) | $\lambda_0/a$ |
|---|---|---|---|---|---|---|
| $E_1$ | 0.473 | 0.615 | −8.55 | 1.69 | 30.0 | 12.7 |
| $E_2$ | 0.724 | 0.862 | −8.06 | 1.42 | 19.1 | 8.3 |
| $E_3$ | 0.822 | 1.092 | −13.4 | 1.76 | 32.8 | 7.3 |
| $E_4$ | 0.834 | 1.264 | −14.5 | 2.30 | 51.6 | 7.2 |
| $E_5$ | 0.885 | 1.220 | −17.9 | 1.90 | 27.5 | 6.8 |
| $E_6$ | 0.966 | 1.396 | −11.5 | 2.09 | 44.5 | 6.2 |

What is claimed is:

1. An apparatus for modulating terahertz radiation, comprising:
    a substrate comprising a doped semiconductor material;
    an array of multi-loop split-ring resonators on said substrate;
    said multi-loop split ring resonators of a size less that the wavelength of the incident terahertz radiation;
    at least one gap in said split-ring resonators, said gaps configured to modulate the circulation of current flow in said split-ring resonator;
    wherein said at least one gap is configured for generating a resonant response with alternating charge accumulation in response to the presence of said at least one gap; and
    means for externally exciting electrons in said substrate for modulating the resonance of said array of multi-loop split-ring resonators to control the transmissive ratio of said apparatus.

2. An apparatus as recited in claim 1, wherein said multi-loop split ring resonators comprise original metamaterial structures having multiple loops of conductive material within which at least one insulated gap is interposed.

3. An apparatus as recited in claim 1, wherein said multi-loop split ring resonators comprise complementary metamaterial structures having multiple looping regions on said substrate which are non-conductive within which at least one conductive gap is interposed.

4. An apparatus as recited in claim 1, wherein the on-to-off state transmissive ratio of said apparatus is approximately 0.5.

5. An apparatus as recited in claim 1, wherein said at least one gap in said split-ring resonators drives the capacitance toward zero, and thus dampens resonant response, of said split-ring resonators in response to the presence of electrons in said gap.

6. An apparatus as recited in claim 1, wherein said the capacitance of at least one gap in said split-ring resonators increases, and thus increases resonant response, of said split-ring resonators in response to the depletion of electrons from said gap.

7. An apparatus as recited in claim 1, wherein said substrate comprises a sufficiently thin layer of semiconductor to allow the passage of a substantial portion of the terahertz radiation during portions of resonant cycles within said split-ring resonators.

8. An apparatus as recited in claim 1, wherein said substrate comprises a lightly-doped semiconductor material.

9. An apparatus as recited in claim 1, wherein said multi-loop split-ring resonator comprises a pair of concentric conductive rings.

10. An apparatus as recited in claim 1, wherein said multi-loop split-ring resonator provides a resonant response although without a negative refractive index.

11. An apparatus as recited in claim 1, wherein at frequencies near the characteristic frequency of the resonant electron flow the values of permittivity ($\in$) and permeability vary over a wide range in response to small changes in frequency.

12. An apparatus as recited in claim 1, wherein said control of the transmissive ratio of said apparatus is achieved at room temperatures.

13. An apparatus as recited in claim 1, wherein said means for externally exciting said substrate comprises electrical contacts on said substrate configured for receiving a modulating signal which is coupled through conductors to said multi-loop split-ring resonators.

14. An apparatus as recited in claim 1, wherein said electrical contacts comprise at least one ohmic contact and at least one Schottky contact.

15. An apparatus as recited in claim 1, wherein said means for externally exciting said substrate comprises a means of photoexcitation.

16. An apparatus as recited in claim 15, wherein said means of photoexcitation comprises a laser.

17. An apparatus as recited in claim 1, wherein said apparatus is incorporated within a Quantum Cascade Laser (QCL) to permit device operation in a surface emitting mode through said array of multi-loop split-ring resonators configured on an active region of said QCL device.

18. An apparatus for modulating terahertz radiation, comprising:
    a substrate comprising a thin and lightly-doped semiconductor material;
    wherein said substrate comprises a sufficiently thin layer semiconductor material to allow the passage of a substantial portion of the terahertz radiation during portions of resonant cycles within said split-ring resonators;
    an array of multi-loop split-ring resonators on said substrate;
    said multi-loop split ring resonators of a size less that the wavelength of the incident terahertz radiation;
    at least one gap in said split-ring resonators, said gaps configured to modulate the circulation of current flow in said split-ring resonator;
    wherein said at least one gap is configured for generating a resonant response with alternating charge accumulation in response to the presence of said at least one gap; and
    wherein said at least one gap in said split-ring resonators drives the capacitance toward zero, and thus dampens resonant response, of said split-ring resonators in response to the presence of electrons in said gap;
    wherein said the capacitance of at least one gap in said split-ring resonators increases, and thus increases resonant response, of said split-ring resonators in response to the depletion of electrons from said gap;
    electrical contacts coupled to said array of multi-loop split-ring resonators for exciting electrons in said substrate to control their position in relation to said at least gap in said split-ring resonators and thus modulate the resonance of said array of multi-loop split-ring resonators for controlling the transmissive ratio of said apparatus.

19. A surface emitting (SE) quantum cascade laser (QCL), comprising:
    a substrate comprising a doped semiconductor material;
    a first electrode on the surface of said substrate;
    an active region upon said first electrode;
    a second electrode comprising an array of multi-loop split-ring resonators on the surface of said active region;
    said multi-loop split ring resonators of a size less that the wavelength of the characteristic terahertz radiation;
    at least one gap in said split-ring resonators, said gap configured to modulate the circulation of current flow in said split-ring resonator;
    wherein said at least one gap is configured for generating a resonant response with alternating charge accumulation in response to the presence of said at least one gap; and
    contacts on said first electrode and said second electrode through which a modulation signal is received for exciting electrons in said active region for modulating the resonance of said array of multi-loop split-ring resonators to control the surface emission from said transmissive ratio of said quantum cascade laser.

20. A method of modulating transmissivity of a metamaterial structure at terahertz frequencies, comprising:
    establishing a periodic array of metamaterial elements upon a semiconductor device layer;
    configuring each metamaterial element to have multiple loops with at least one gap;
    receiving an electrical modulation signal for controlling the transmissivity of said metamaterial structure;
    depleting the number of electrons near said at least one gap of said periodic array of metamaterial structures to provide a first level of transmissivity in response to a first level of electrical modulation;
    enhancing the number of electrons near said at least one gap of said periodic array of metamaterial structures to provide a second level of transmissivity in response to a second level of electrical modulation; and
    generating a resonant response with alternating charge accumulation near said at least one gap in each said metamaterial element in said periodic array in response to the presence of electrons near said at least one gap in each said metamaterial element toward changing transmissivity.

* * * * *